(12) United States Patent
Ghadiri Moghaddam et al.

(10) Patent No.: US 10,197,310 B2
(45) Date of Patent: Feb. 5, 2019

(54) SYSTEMS AND METHODS FOR MANAGING CONDITIONS IN ENCLOSED SPACE

(71) Applicant: Nortek Air Solutions Canada, Inc., Saskatoon (CA)

(72) Inventors: Davood Ghadiri Moghaddam, Saskatoon (CA); Philip Paul LePoudre, Saskatoon (CA); Manfred Gerber, Saskatoon (CA)

(73) Assignee: Nortek Air Solutions Canada, Inc., Saskatoon (CA)

( * ) Notice: Subject to any disclaimer, the term of this patent is extended or adjusted under 35 U.S.C. 154(b) by 344 days.

(21) Appl. No.: 14/744,950

(22) Filed: Jun. 19, 2015

(65) Prior Publication Data

US 2015/0369527 A1 Dec. 24, 2015

Related U.S. Application Data

(60) Provisional application No. 62/014,985, filed on Jun. 20, 2014, provisional application No. 62/027,050, filed on Jul. 21, 2014.

(51) Int. Cl.
  *F24F 1/00* (2011.01)
  *F25B 25/00* (2006.01)
  (Continued)

(52) U.S. Cl.
  CPC .......... *F25B 25/005* (2013.01); *F24F 3/1423* (2013.01); *F24F 5/0035* (2013.01);
  (Continued)

(58) Field of Classification Search
  CPC ...... F24F 3/1423; F24F 12/006; F24F 5/0035; F24F 2001/0092; F24F 2203/104; Y02B 30/545; Y02B 30/563; F25B 25/005
  See application file for complete search history.

(56) References Cited

U.S. PATENT DOCUMENTS 1,746,598 A 2/1930 Ljungstrom
2,964,298 A 12/1960 McIntosh et al.
(Continued)

FOREIGN PATENT DOCUMENTS

CN 107208910 A 9/2017
EP 2079000 A2 7/2009
(Continued)

OTHER PUBLICATIONS

"Case Study: Sabey Intergate.Quincy Oasis™ IEC", [online]. [retrieved on Aug. 1, 2016]. Retrieved from the Internet: <URL: https://webdh.munters.com/webdh/BrochureUploads/Case%20Study-%20Sabey-Intergate-Quincy.pdf>, (2016), 2 pgs.
(Continued)

*Primary Examiner* — Ana M Vazquez
(74) *Attorney, Agent, or Firm* — Schwegman Lundberg & Woessner, P.A.

(57) ABSTRACT

Systems and methods for controlling temperature in an enclosed space can include an air-to-air heat exchanger (AAHX) and a direct evaporative cooler (DEC). The DEC can be located in a scavenger or outdoor air stream such that the DEC cools the outdoor air, which is then used to cool or reject heat from a process air stream passing through the AAHX. In an example, the AAHX can be a sensible wheel. In another example, the AAHX can be a counter-flow flat plate. The system can operate in various modes, including an economizer mode and an evaporation mode, depending, in part, on the outdoor air conditions and a load on the system. In some examples, the system can include a DX coil to provide additional cooling to the process air in another operating mode.

13 Claims, 14 Drawing Sheets

(51) Int. Cl.
　　　*F24F 3/14*　　　(2006.01)
　　　*F24F 5/00*　　　(2006.01)
　　　*F24F 12/00*　　 (2006.01)
(52) U.S. Cl.
　　　CPC .... *F24F 12/006* (2013.01); *F24F 2001/0092* (2013.01); *F24F 2203/104* (2013.01); *Y02B 30/545* (2013.01); *Y02B 30/563* (2013.01)

(56) References Cited

U.S. PATENT DOCUMENTS

| | | |
|---|---|---|
| 3,789,916 A | 2/1974 | Lindahl |
| 3,807,493 A | 4/1974 | Stewart et al. |
| 3,965,695 A | 6/1976 | Rush et al. |
| 4,426,853 A | 1/1984 | Mitani et al. |
| 4,827,733 A | 5/1989 | Dinh |
| 5,003,961 A | 4/1991 | Besik |
| 5,238,052 A | 8/1993 | Chagnot |
| 5,239,834 A | 8/1993 | Travers |
| 5,579,647 A | 12/1996 | Calton et al. |
| 5,649,428 A | 7/1997 | Calton et al. |
| 5,660,048 A | 8/1997 | Belding et al. |
| 5,727,394 A | 3/1998 | Belding et al. |
| 5,758,508 A | 6/1998 | Belding et al. |
| 5,771,707 A | 6/1998 | Lagacé et al. |
| 5,777,846 A | 7/1998 | Hayes et al. |
| 5,791,153 A | 8/1998 | Belding et al. |
| 5,832,988 A | 11/1998 | Mistry et al. |
| 5,957,194 A | 9/1999 | Azar |
| 6,003,327 A | 12/1999 | Belding et al. |
| 6,004,384 A | 12/1999 | Caudle |
| 6,018,953 A | 2/2000 | Belding et al. |
| 6,029,462 A | 2/2000 | Denniston |
| 6,034,873 A | 3/2000 | Stahl et al. |
| 6,050,100 A | 4/2000 | Belding et al. |
| 6,055,157 A | 4/2000 | Bartilson |
| 6,104,003 A | 8/2000 | Jones |
| 6,119,768 A | 9/2000 | Dreier |
| 6,141,979 A | 11/2000 | Dunlap |
| 6,164,369 A | 12/2000 | Stoller et al. |
| 6,199,388 B1 | 3/2001 | Fischer |
| 6,201,705 B1 | 3/2001 | Nygren et al. |
| 6,292,365 B1 | 9/2001 | Ashiwake et al. |
| 6,305,180 B1 | 10/2001 | Miller |
| 6,311,511 B1 | 11/2001 | Maeda |
| 6,361,585 B1 | 3/2002 | Anzai et al. |
| 6,409,157 B1 | 6/2002 | Lundin |
| 6,430,044 B2 | 8/2002 | Hutchinson et al. |
| 6,494,050 B2 | 12/2002 | Spinazzola et al. |
| 6,507,494 B1 | 1/2003 | Hutchison et al. |
| 6,557,365 B2 | 5/2003 | Dinnage et al. |
| 6,557,624 B1 | 5/2003 | Stahl et al. |
| 6,574,104 B2 | 6/2003 | Patel et al. |
| 6,591,898 B1 | 7/2003 | Chu et al. |
| 6,611,428 B1 | 8/2003 | Wong |
| 6,612,365 B1 | 9/2003 | Saishu et al. |
| 6,622,508 B2 | 9/2003 | Dinnage |
| 6,625,017 B1 | 9/2003 | Lin |
| 6,628,520 B2 | 9/2003 | Patel et al. |
| 6,684,653 B2 | 2/2004 | Des Champs et al. |
| 6,694,759 B1 | 2/2004 | Bash et al. |
| 6,705,389 B1 | 3/2004 | Stahl et al. |
| 6,711,907 B2 | 3/2004 | Dinnage et al. |
| 6,714,412 B1 | 3/2004 | Chu et al. |
| 6,719,038 B2 | 4/2004 | Bird et al. |
| 6,742,583 B2 | 6/2004 | Tikka et al. |
| 6,744,632 B2 | 6/2004 | Wilson |
| 6,745,579 B2 | 6/2004 | Spinazzola et al. |
| 6,745,826 B2 | 6/2004 | Lowenstein et al. |
| 6,747,872 B1 | 6/2004 | Patel et al. |
| 6,786,056 B2 | 9/2004 | Bash et al. |
| 6,819,563 B1 | 11/2004 | Chu et al. |
| 6,867,967 B2 | 3/2005 | Mok |
| 6,868,683 B2 | 3/2005 | Bash et al. |
| 6,877,551 B2 | 4/2005 | Stoller |
| 6,880,349 B2 | 4/2005 | Johnson et al. |
| 6,917,522 B1 | 7/2005 | Erturk et al. |
| 6,927,980 B2 | 8/2005 | Fukuda et al. |
| 6,936,767 B2 | 8/2005 | Kleinecke et al. |
| 6,973,801 B1 | 12/2005 | Campbell et al. |
| 7,007,506 B2 | 3/2006 | Kubo et al. |
| 7,017,655 B2 | 3/2006 | Wilson |
| 7,042,722 B2 | 5/2006 | Suzuki et al. |
| 7,047,751 B2 | 5/2006 | Dinnage et al. |
| 7,086,603 B2 | 8/2006 | Bash et al. |
| 7,128,138 B2 | 10/2006 | Des Champs |
| 7,139,169 B2 | 11/2006 | Alperin et al. |
| 7,180,737 B2 | 2/2007 | Straub, Jr. et al. |
| 7,187,547 B1 | 3/2007 | French et al. |
| 7,222,660 B2 | 5/2007 | Giacoma et al. |
| 7,262,964 B1 | 8/2007 | Barsun |
| 7,274,568 B1 | 9/2007 | Chayut |
| 7,278,273 B1 | 10/2007 | Whitted et al. |
| 7,312,993 B2 | 12/2007 | Bundza et al. |
| 7,313,924 B2 | 1/2008 | Bash et al. |
| 7,315,448 B1 | 1/2008 | Bash et al. |
| 7,319,596 B2 | 1/2008 | Fujiya et al. |
| 7,347,058 B2 | 3/2008 | Malone |
| 7,362,571 B2 | 4/2008 | Kelley et al. |
| 7,379,299 B2 | 5/2008 | Walsh et al. |
| 7,385,810 B2 | 6/2008 | Chu et al. |
| 7,389,646 B2 | 6/2008 | Moffitt |
| 7,392,836 B2 | 7/2008 | Wong |
| 7,403,392 B2 | 7/2008 | Attlesey et al. |
| 7,418,995 B2 | 9/2008 | Howard et al. |
| 7,438,638 B2 | 10/2008 | Lewis, II |
| 7,457,112 B2 | 11/2008 | Fukuda et al. |
| 7,518,867 B2 | 4/2009 | Yazawa et al. |
| 7,573,713 B2 | 8/2009 | Hoffman et al. |
| 7,586,741 B2 | 9/2009 | Matsushima et al. |
| 7,586,745 B1 | 9/2009 | Szelong et al. |
| 7,591,868 B2 | 9/2009 | Johnson |
| 7,595,985 B2 | 9/2009 | Adducci et al. |
| 7,596,476 B2 | 9/2009 | Rasmussen et al. |
| 7,604,534 B2 | 10/2009 | Hill |
| 7,604,535 B2 | 10/2009 | Germagian et al. |
| 7,643,285 B2 | 1/2010 | Nishiyama et al. |
| 7,647,787 B2 | 1/2010 | Belady et al. |
| 7,675,748 B2 | 3/2010 | Matsushima et al. |
| 7,679,909 B2 | 3/2010 | Spearing et al. |
| 7,682,234 B1 | 3/2010 | Beitelmal et al. |
| 7,716,829 B2 | 5/2010 | Des Champs |
| 7,717,406 B2 | 5/2010 | Graef |
| 7,729,115 B2 | 6/2010 | Hall et al. |
| 7,733,648 B2 | 6/2010 | Fujiya et al. |
| 7,753,766 B2 | 7/2010 | Master et al. |
| 7,798,892 B2 | 9/2010 | Aiello et al. |
| 7,830,658 B2 | 11/2010 | Van Andel |
| 7,841,199 B2 | 11/2010 | VanGilder et al. |
| 7,864,527 B1 | 1/2011 | Whitted |
| 7,870,893 B2 | 1/2011 | Ouyang et al. |
| 7,885,795 B2 | 2/2011 | Rasmussen et al. |
| 7,895,854 B2 | 3/2011 | Bash |
| 7,995,339 B2 | 8/2011 | Bash et al. |
| 8,201,616 B2 | 6/2012 | Kim et al. |
| 8,267,164 B2 | 9/2012 | Lestage et al. |
| 8,267,758 B2 | 9/2012 | Liu et al. |
| 8,327,656 B2 | 12/2012 | Tutunoglu et al. |
| 8,464,781 B2 | 6/2013 | Kenny et al. |
| 8,631,661 B2 | 1/2014 | Teige et al. |
| 8,747,531 B2 | 6/2014 | Dinnage |
| 8,978,741 B2 | 3/2015 | Sharma et al. |
| 2003/0050003 A1 | 3/2003 | Charron |
| 2004/0060315 A1 | 4/2004 | Dinnage et al. |
| 2007/0079623 A1 | 4/2007 | Inaba et al. |
| 2007/0125110 A1 | 6/2007 | Abel |
| 2010/0058778 A1 | 3/2010 | Bhatti et al. |
| 2010/0192605 A1 | 8/2010 | Fang et al. |
| 2011/0048687 A1 | 3/2011 | Des Champs |
| 2011/0174003 A1 | 7/2011 | Wenger |
| 2011/0256822 A1 | 10/2011 | Carlson |
| 2011/0315350 A1 | 12/2011 | Curtis |
| 2012/0131796 A1 | 5/2012 | Des Champs |
| 2012/0167600 A1 | 7/2012 | Dunnavant |

(56) References Cited

U.S. PATENT DOCUMENTS

| | | | |
|---|---|---|---|
| 2012/0167610 | A1 | 7/2012 | Dunnavant |
| 2012/0168119 | A1 | 7/2012 | Dunnavant |
| 2012/0171943 | A1 | 7/2012 | Dunnavant |
| 2012/0204717 | A1 | 8/2012 | Dinnage |
| 2012/0298334 | A1 | 11/2012 | Madaffari et al. |
| 2013/0010423 | A1 | 1/2013 | Carlson |
| 2013/0023196 | A1 | 1/2013 | Fisher et al. |
| 2013/0094136 | A1 | 4/2013 | Gross et al. |
| 2013/0298580 | A1 | 11/2013 | Dinnage |
| 2014/0235157 | A1* | 8/2014 | Wawryk ............... F24F 12/001 454/233 |

FOREIGN PATENT DOCUMENTS

| | | |
|---|---|---|
| EP | 1266548 B2 | 7/2015 |
| WO | WO-2008041788 A1 | 4/2008 |
| WO | WO-2013/029148 A1 | 3/2013 |
| WO | WO-2014/138851 A1 | 9/2014 |
| WO | WO-2015/192249 A1 | 12/2015 |

OTHER PUBLICATIONS

"Climate Wizard: How it Works", [online]. [retrieved on Aug. 1, 2016]. Retrieved from the Internet: <URL: http://www.climatewizard.com/how-it-works>, (2016), 3 pgs.

"Coolers & Humidifiers", Oasis tm IEC—Americas [online]. [retrieved on Aug. 1, 2016]. Retrieved from the Internet: <URL: https://www.munters.com/en/munters/products/coolers--humidifiers/oasis-indirect-evaporative-coolers-iec/>, (2016), 2 pgs.

"Excool Brochure", [online]. [retrieved on Aug. 1, 2016]. Retrieved from the Internet: <URL http://excool.com/userfiles/files/Excool-Brochure.pdf>, (2016), 12 pgs.

"GEA Adia-DENCO(R) Data center cooling with highest energy efficiency", [online]. [retrieved on Aug. 1, 2016]. Retrieved from the Internet: <URL: http://eviss.bg/web/wp-content/uploads/2013/09/GEA-Adia-DENCO-Data-Facts-PDF-33-MB.pdf>, (Feb. 2013), 10 pgs.

"HTK-SE Hybrid Dry Cooler", [online] JAEGGI Hybridtechnologie AG [retrieved on Aug. 1, 2016]. Retrieved from the Internet: <URL: http://www.jaeggi-hybrid.eu/fileadmin/literature/europe/JAEGGI/HTK_SE/JAEGGI_HTK-SE_Info_EN.pdf>, (Jan. 6, 2014), 11 pgs.

"Oasis™ tm Product Guide", [online]. [retrieved on Aug. 1, 2016]. Retrieved from the Internet: <URL: https://www.munters.com/globalassets/inriver/resources/product_guide_oasis_europe_web.pdf>, (2016), 12 pgs.

"Sustainable cooling for data centres", © Agentschap NL / Jul. 2012, NL Agency, Ministry of Economic Affairs, Agriculture and Innovaction, (Jul. 2012), 26 pgs.

"The Coolerado HMX Difference", [online]. © 2016 Coolerado [retrieved on Aug. 1, 2016]. Retrieved from the Internet: <URL: http://www.coolerado.com/products/hmx/>, (2016), 4 pgs.

Pesaran, Ahmad A., "A Review of Desiccant Dehumidification Technology", National Renewable Energy Laboratory, (Oct. 1994), 10 pgs.

Sullivan, Robert F., et al., "Analysis of the KyotoCooling Process: Introduction to the New KPN CyberCenters", Uptime Institute Research Underwriter White Paper, IT Symposium—Lean, Clean & Green, (2009), 13 pgs.

"International Application Serial No. PCT/CA2015/050570, International Search Report dated Sep. 1, 2015", 4 pgs.

"International Application Serial No. PCT/CA2015/050570, Written Opinion dated Sep. 1, 2015", 4 pgs.

"Kyoto Cooling(r) Utilizes Award-Winning Technology to Re-Invent Computer Room Air Conditioning (CRAC) Units with Release of Series 100", [online]. (c) 2014 Air Enterprises [retrieved on Dec. 5, 2014]. Retrieved from the Internet: <URL: http://airenterprises.com/?s-series+100&x=0&y-0>, (2014), 14 pgs.

"Series 100—Smarter cooling for data centers", Kyoto Cooling [online]. Retrieved from the Internet: <URL: http://airenterprises.com/wp-content/uploads/2014/05/KyotoCooling-Series100-lowres.pdf>, (2014), 5 pgs.

"Datacom Eqquipment Power Trends and Cooling Applications", ASHRAE, (2005), 124 pgs.

"Design Considerations for Datacom Equipment Centers", ASHRAE, (2005), 204 pgs.

"European Application Serial No. 15809541.4, Extended European Search Report dated Jan. 4, 2018", 7 pgs.

"European Application Serial No. 15809541.4, Response filed Aug. 3, 2017 to Communication Pursuant to Rules 161(2) and 162 EPC dated Feb. 23, 2017", 4 pgs.

"High Performance Data Centers a Design Guidelines Sourcebook", (Jan. 2006), 63 pgs.

"Thermal Guidelines for Data Processing Environments", ASHRAE, (2004), 55 pgs.

Bonilla, Charles F., "Thermowheel Rotary Air-to-Air Heat Exchanger", Archives of Environmental Health: An International Journal, 4:3, (Mar. 4, 1962), pp. 285-294.

Corbett, Robert J., et al., "Heat Recovery Ventilation for Housing", Superintendent of Documents, U.S. Government Printing Office, Washington, D.C. 20402, (Mar. 1984), 38 pgs.

PM-LUFT, "The Gold Air Handling Unit,", (2000), 60 pgs.

Rasmussen, Neil, "Electrical Efficiency Modeling for Data Centers", American Power Conversion white paper, (Oct. 26, 2005), 20 pgs.

Swegon, "Cooling Unit—Cooler Installation and Maintenance Instructions", GB.COOLER.INST.060501, (2006), 34 pgs.

Swegon, "Operating and Maintenance Instructions for the Gold Air Handling Unit", GB.GOLDSK.050101, (2005), 74 pgs.

"European Application Serial No. 15809541.4, Response filed Aug. 2, 2018 to Extended European Search Report dated Jan. 4, 2018", 42 pgs.

"European Application Serial No. 15809541.4, Communication Pursuant to Article 94(3) EPC dated Aug. 24, 2018", 5 pgs.

\* cited by examiner

SYSTEMS AND METHODS FOR MANAGING CONDITIONS IN ENCLOSED SPACE

CLAIM OF PRIORITY

This application claims the benefit of U.S. Provisional Patent Application Ser. No. 62/014,985, filed on Jun. 20, 2014, and also claims the benefit of U.S. Provisional Patent Application Ser. No. 62/027,050, filed on Jul. 21, 2014, the benefit of priority of each of which is claimed hereby, and each of which are incorporated by reference herein in its entirety.

TECHNICAL FIELD

The present patent application relates to heating and cooling, and more particularly, to cooling systems and methods for cooling an enclosed space, including, for example, a data center.

BACKGROUND

There are many applications for which controlling the environmental conditions within an enclosed space is important—for example, cooling data centers. A data center usually consists of computers and associated components operating 24 hours a day, 7 days a week. The electrical components in data centers produce a lot of heat, which needs to be removed from the space. Air-conditioning systems in data centers can consume as much as 40% of the total energy.

There are several methods to reduce the air-conditioning system's energy consumption in cooling only applications such as data centers, including, for example, conventional evaporative/adiabatic coolers, including indirect/hybrid designs for space cooling. Two general methods currently used are air-side economizers and water-side economizers. The air-side economizer runs outdoor air into the data center whenever outdoor air conditions are suitable to reject the heat from the data center. Using the air-side economizer can increase the risk of dust accumulation and air contaminants inside the space and may be limited to relatively cold and dry climates. The water-side economizer is usually a cooling tower which cools some or all of the return water in a chilled water loop. Water mineral deposition, micro-organisms and biofilm growth (e.g. Legionella bacteria), corrosion of metal components and other maintenance challenges in the tower are some of the drawbacks for the water-side economizer. Also, the water-side economizer application may be limited to relatively hot and dry climates.

Another recent cooling method is using direct evaporative coolers (DEC) to cool buildings and other enclosed spaces. Conventional direct evaporative coolers, although typically more energy efficient than vapor compression systems, have some drawbacks. The supply air temperature coming out of the cooler may be challenging to control and is dependent on the outdoor air temperature and humidity level. The supply air may be excessively humid. These systems need careful maintenance to ensure that bacteria, algae, fungi and other contaminants do not proliferate in the water system and transfer into the supply air stream. Since these systems utilize direct contact between the evaporating liquid water and supply air, carryover of contaminants into the air stream can occur, which can, in turn, lead to reduced indoor air quality, odors and "sick building syndrome." Also, buildup of mineral deposits in the unit and on the evaporative pads can reduce performance and require maintenance.

In addition to maintenance challenges, direct and indirect evaporative coolers are typically limited to cooling temperatures no lower than the wet bulb temperature of the air stream travelling through the evaporative device. For example, if an indirect evaporative cooler uses outdoor scavenging air, the cooler may fail to meet the required cooling temperatures or handle the sensible load of a building space whenever the outside air wet bulb temperature becomes too high. This may limit the range of climate conditions suitable for the evaporative cooling technology, or necessitate the use of back up chillers whenever the evaporative system loses capacity. Redundant cooling equipment further increases the cost and complexity of the system.

OVERVIEW

The present inventors recognize, among other things, an opportunity for improved performance in providing cooling to an enclosed space using a combination of a direct evaporative cooler (DEC) in a scavenger air stream and an air-to-air heat exchanger exchanging heat between the scavenger air stream and a process air stream.

The following non-limiting examples pertain generally, but not by way of limitation, to systems and methods for cooling an enclosed space, including, for example, a data center. The following non-limiting examples are provided to further illustrate the systems and methods disclosed herein.

Examples according to this disclosure include an integrated sensible wheel, or other type of air-to-air heat exchanger (AAHX), and a direct evaporative cooler (DEC) to indirectly and sensibly cool process air. A pre-cooler coil may be included upstream of the DEC to achieve cooling temperatures below the outdoor air wet-bulb temperature. A direct expansion (DX) cooling system with an air-cooled or water-cooled condenser may also be included to achieve a target cold aisle supply temperature in relatively hot and humid climates. The proposed systems and methods may improve on performance, packaging and price of existing direct/indirect evaporative cooling/hybrid systems in the market for data center (and other enclosed space) cooling.

Although some of the following examples are described in the context of cooling data centers, examples according to this disclosure, including the combination of a sensible wheel and DEC, can be employed to control other environmental conditions within other types of enclosed spaces.

Using the proposed system, which is an air-to-air heat exchanger (AAHX) in combination with a direct evaporative cooler (DEC) in a scavenger air stream, a number of advantages may be realized. In examples, a sensible wheel is combined with a DEC to deliver improved performance over other types of AAHXs (such as, heat pipe, glycol run-around loop and cross-flow flat-plate AAHX) for cooling applications (such as data center cooling). In examples, a counter-flow AAHX is combined with a DEC to deliver improved performance. Such example systems and methods may provide a number of advantages over conventional evaporative/hybrid cooling systems as outlined in more detail below. The proposed system indirectly cools the process air from the enclosed space, which can reduce the risk of dust accumulation and outdoor air contaminant transfer to the space. Thus, the proposed system may significantly reduce the air filtration required for alternative cooling systems. Also, the proposed system sensibly cools the process air, which can provide better humidity control for enclosed spaces such as data centers.

Examples according to this disclosure can be used for both roof-top and end-on delivery applications, which can expand applicability of such systems and methods to different market conditions. Some examples described below include integration of a supplementary mechanical cooling system (e.g., direct expansion, or "DX" cooling system) with an air-cooled/water cooled condenser, along with the sensible wheel and DEC system, to provide further cooling to the process air, as necessary. Using the cold water of the DEC, which is at the scavenger air wet-bulb temperature, in the water-cooled condenser can boost the DX cooling system and overall system performance.

Example systems and methods may also allow an evaporative system to achieve cooling temperatures lower than the scavenging air wet bulb temperature using a pre-cooler upstream of the direct evaporative cooler (DEC). This expands the operating range of the evaporative cooler and may eliminate the need for back-up chillers or other equipment (i.e. a backup DX cooling system) in many climates. In addition, various proposed configurations of components and airflow paths may improve the overall system efficiency, flexibility and potential for commercialization in a number of different markets compared to other evaporative technologies.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present application relates to systems and methods for controlling conditions, such as temperature, inside an enclosed space, such as, for example, a data cooling center. The system can include a direct evaporative cooler (DEC) in combination with an air-to-air heat exchanger (AAHX). The DEC can be located in an outdoor or scavenger air stream and used to cool the scavenger air, which, in turn, cools the process air in the AAHX. The system can include roof-top or end-on delivery applications.

Figure 1:
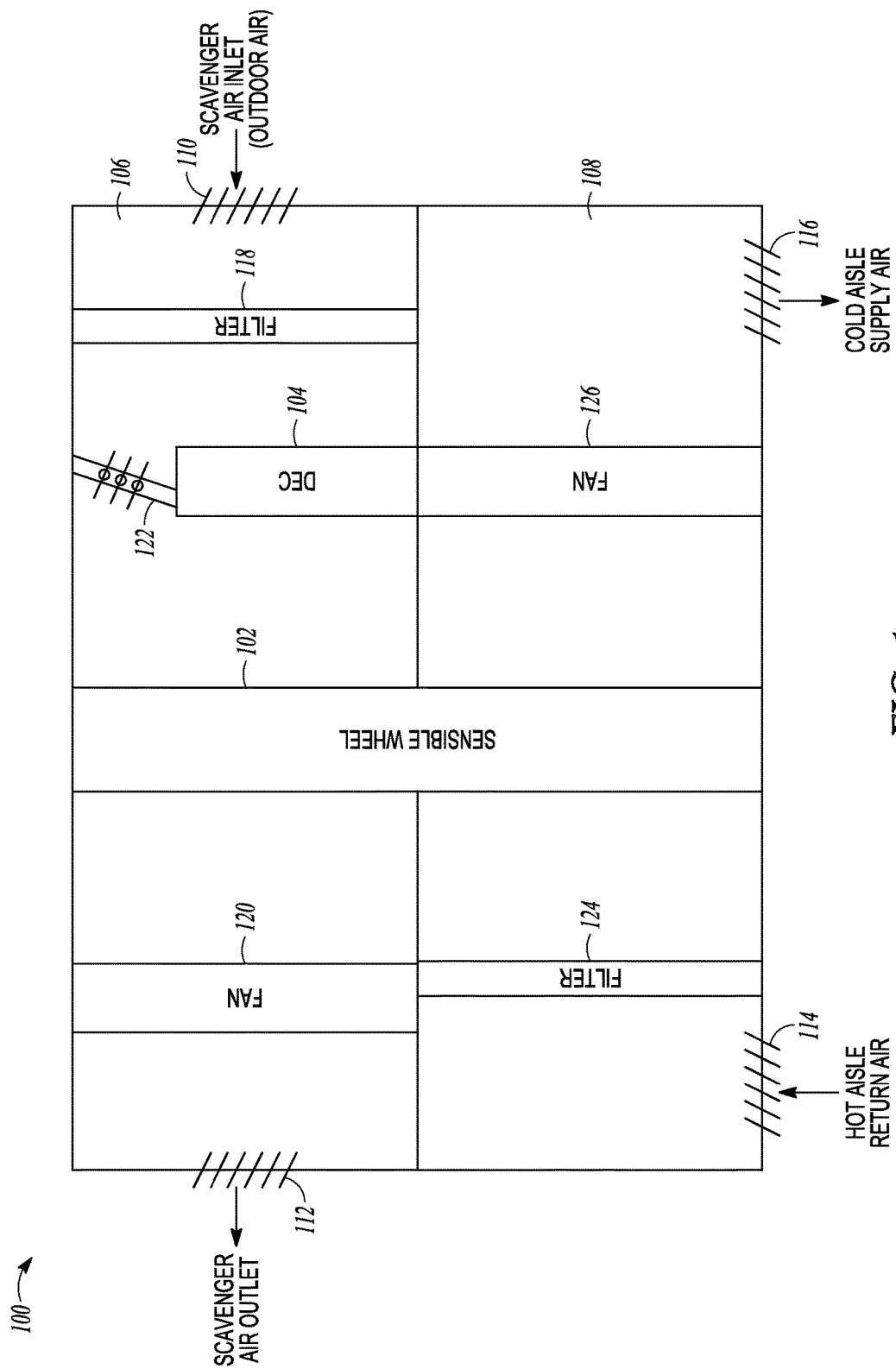
FIG. 1 is a schematic of an example roof-top system in accordance with the present patent application.
Figure 4:
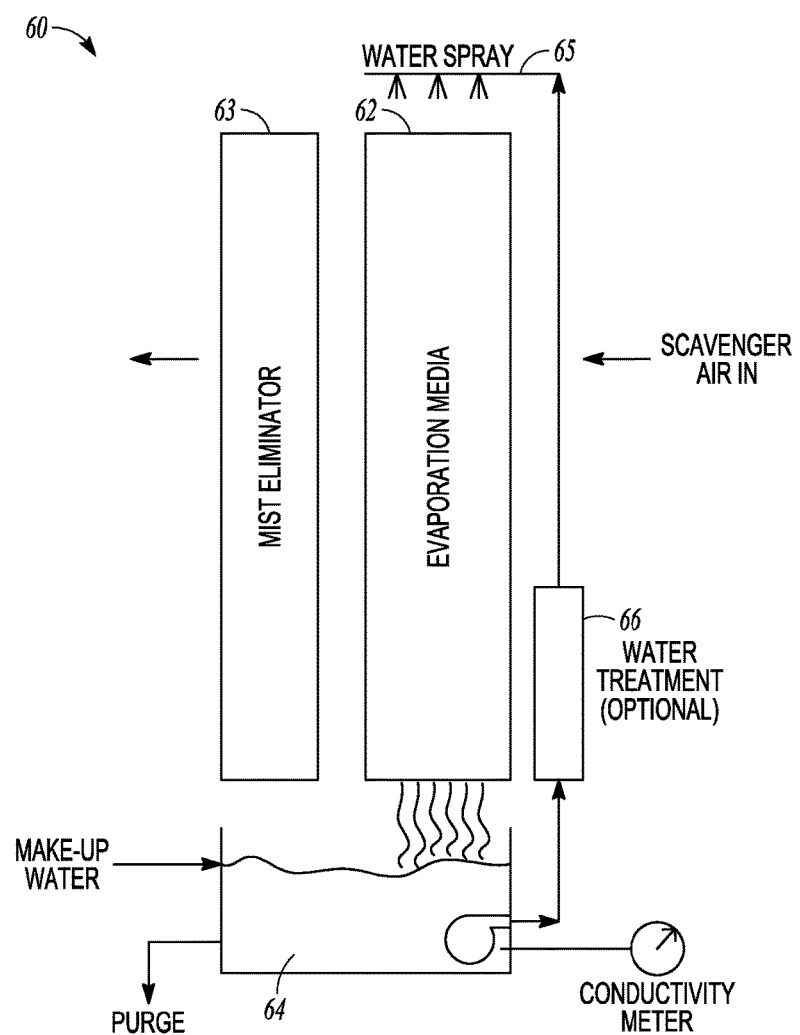
FIG. 4 is a schematic of an example direct evaporative cooler (DEC) for use in a roof-top or end-on delivery system in accordance with the present patent application.

FIG. 1 depicts an example roof-top system 100 including a sensible wheel 102 and a direct evaporative cooler (DEC) 104. FIG. 4 illustrates an example of a DEC configured for use in the roof-top system 100 and is further described below. The sensible wheel 102 is an example of an air-to-air heat exchanger (AAHX) which can be used in combination with the DEC 104. The system 100 of FIG. 1 is a two-level unit, in which the scavenger air stream flows through a top level 106 and the process air stream flows through a bottom level 108. The scavenger air stream, or outdoor air, enters the top level 106 through a scavenger air inlet 110 and exits the top level 106 through a scavenger air outlet 112. The process air stream, from a data center, for example, enters the bottom level 108 at a process air inlet 114 as hot aisle return air and exits the bottom level 108 at a process air outlet 116 as cold aisle supply air.

The scavenger air inlet 110 and outlet 112, as well as the process air inlet 114 and outlet 116, can be configured as dampers such that the inlets and outlets can be open or shut to allow or prevent air flow.

On the top level 106, the system 100 can include a filter 118 before the DEC 104, a fan 120 after the sensible wheel 102, and a bypass damper 122 between the DEC 104 and the sensible wheel 102. On the bottom level 108, the system 100 can include a filter 124 before the sensible wheel 102 and a fan 126 after the sensible wheel 102. It is recognized that the system 100 can include more or less fans and filters than what is shown in FIG. 1 and some or all of the fans and filters may be optional. Moreover, the fans and filters can be located in different locations within the system 100 relative to what is shown in FIG. 1. The fan 120 in the top level 106 or the fan 126 in the bottom level 108 can be configured as a single fan or multiple fans, including a fan array, such as, for example, FANWALL® Systems provided by Nortek Air Solutions. The description in this paragraph about the fans and filters can apply to the other systems, including roof-top or end-on applications, described herein.

In one example, the system 100 of FIG. 1 can operate in at least two modes—an evaporation mode and an economizer mode. In an evaporation mode, the scavenger air enters the unit at the inlet 110 and passes through the DEC 104 and is cooled to its wet-bulb temperature. The scavenger air then passes through the sensible wheel 102 and indirectly cools the process air in the bottom level 108, which is also passing through the sensible wheel 102. The scavenger air exiting the system 100 at the scavenger air outlet 112 is at a higher temperature and humidity since it has been used to cool the process air passing through the sensible wheel 102. The process air exiting the system 100 at the process air outlet 116 is thus at a lower temperature compared to at the process air inlet 114 and can be supplied to wherever the cooler air is needed. In an example, the process air can be supplied back to the data center as cooler air. In the evaporation mode, the bypass damper 122 can be closed.

In an economizer mode, the bypass damper 122 can be open and the scavenger air inlet 110 can be closed. With the bypass damper 122 open, the scavenger air can enter the top level 106 downstream of the DEC 104 and bypass the DEC 104. This can result in a reduction of the pressure drop of the scavenger air through the top level 106 that is caused at least in part by the DEC 104. The system 100 can operate in the economizer mode if the outdoor (scavenger) air is at a temperature low enough to indirectly cool the data center process air to the target or set point temperature without the scavenger air passing through the DEC 104. In one example, determination of the operating mode can be based on the supply air at the process air outlet 116 and comparison of a measured process air outlet temperature 116 with a target or set point temperature for the supply air.

It is recognized that it can be desirable to hold the temperature of the process supply air at or near a supply air temperature set point or range. For example, it may be common to set the target supply air temperature at approximately 75 degree Fahrenheit. However, the set point can be changed during operation of the system 100. In one example, if the outdoor air conditions are hot, the set point may be increased or a range may be provided. This can allow the system to run in an economizer mode over a larger range of conditions.

In the economizer mode, the scavenger air enters the top level 106 through the bypass damper 122 and passes through the sensible wheel 102 to indirectly cool the process air, as described above. In one example, the bypass damper 122 for the DEC 104 is located in the top level 106 at such a position that essentially 100% of the scavenger air bypasses the DEC 104, even though the bypass damper 122 is shown in FIG. 1 as being in line with the DEC 104. (This applies to the bypass dampers for the DEC of other systems shown in later figures and described herein—the DEC bypass damper can allow for all of the scavenger air to bypass the DEC by locating the bypass damper downstream of the DEC and closing the scavenger air inlet 110.)

The scavenger air exits the top level 106 at the scavenger air outlet 112 at a higher temperature, relative to its temperature when entering through the bypass damper 122. In the economizer mode, the process air passes through the bottom level 108 as described above for the evaporation mode—hot process air enters the unit from the process air inlet 114, passes through the wheel 102 and is indirectly cooled to a lower temperature. The process air exiting the bottom level 108 at the outlet 116 is thus at a lower temperature relative to at the inlet 114.

In some examples, the system of FIG. 1 is a 100% recirculation system for the data center air, or air from another enclosed space. The hot data center air enters the system 100 at the process inlet 114 and passes through the filter 124, the sensible wheel 102, and the fan 126. The data center or process air is conditioned (indirectly cooled) using the scavenger air. The data center or process air then exits the system 100 at the process outlet 116 as cold aisle supply air. Essentially all of the hot aisle return air that enters the bottom level 106 is returned to the data center, or other enclosed space, as cold aisle supply air. It is recognized that some process air may be lost, for example, to leakage in the sensible wheel 102.

The process and scavenger air streams pass through the system 100 in separate flow paths. The flow path of the process air stream is through the bottom level 108 and the flow path of the scavenger air stream is through the top level 106. The system 100 can include a partition separating the top 106 and bottom 108 levels. As such, the flow paths do not mix with each other. The sensible wheel 102 can span, or be disposed at least partially in, both the top 106 and bottom 108 levels. Although the flow path of the scavenger air and the flow path of the process air can remain separate from one another, it is recognized that a minimal amount of process air or a minimal amount of scavenger air can be lost to the sensible wheel 102 or other AAHX used in place of the sensible wheel 102. It is the scavenger air stream that conditions the process air stream by first passing through the DEC 104 and then indirectly cooling the process air stream in the wheel 102.

As described above, in some examples, a determination of the operating mode of the system 100 can be based in part, on a set point temperature for the process air at the outlet 116. In some examples, the system 100 can operate based on a process air outlet set point of 75 degree Fahrenheit. In other examples, it can be acceptable to operate the system 100 at a process air outlet range, such as for example, 75 to 78 degree Fahrenheit. Thus the system 100 can operate in an economizer mode so long as the process air at the outlet 116, which is supplied back to the enclosed space, is at a temperature below the upper limit, such as, 78 degree Fahrenheit. If the system cannot operate in the economizer mode and delivery an outlet temperature below 78 degree Fahrenheit, the system 100 can change to an evaporation mode. Additional cooling can be provided from the DEC 104 in the evaporation mode to return the process air outlet temperature to an acceptable value or range. The wheel speed of the sensible wheel 102 and the flow rate of the scavenger air can be varied and controlled as part of the operation of the system 100 to meet the set point or range for the cold aisle supply air.

In some examples, the system 100 of FIG. 1 may exhibit the following characteristics and/or operate according to the following parameters. This assumes the process air at the inlet 114 is at 102 degree Fahrenheit and the process air at the outlet 116 is at 75 degree Fahrenheit, the sensible wheel 102 has 78% sensible effectiveness and the DEC 104 has 95% effectiveness. A temperature of the hot aisle return air (the process air at the inlet 114) may include about a 1-2 degree Fahrenheit temperature increase due to the presence of fans in the system 100 and heat from the fans caused by electrical energy to drive fans. The economizer mode can be employed if the outside air dry bulb (OADB) temperature is less than or equal to approximately 67 degree Fahrenheit. In this mode, a wheel speed of the sensible wheel 102 and a flow rate of the scavenger air through the top level 106 can be varied and controlled. The evaporation mode can be employed if the OADB temperature is greater than 67 degree Fahrenheit and the outside air wet bulb (OAWB) temperatures is less than or equal to 66 degree Fahrenheit. Similarly here, the wheel speed of the sensible wheel 102 and the flow rate of the scavenger air can be varied and controlled.

The above parameters are based on particular specifications for the components in the system 100, including the DEC 104 and the wheel 102. It is recognized that the size or capacity of one or more components can be changed, which can change the overall cooling capacity of the system 100. As described above, the system 100 can be configured to operate at a target or set point temperature (or range having an upper and lower limit) for the process air at the outlet 116—typically the target temperature stays the same during operation of the data center, or whatever environment the process air is being returned to. However, the outside conditions (temperature and humidity) of the scavenger air can vary significantly, and the load or activity of the data center can vary significantly. Thus operation of the system 100 can account for variations in the outside conditions and the activity inside the data center. The above control conditions are provided as examples for determining the operating mode of the system 100. Different thresholds or set points can be used in other examples. Moreover, it is recognized that the thresholds and set points can also vary depending on other factors, such as, for example, the heat load on the system 100.

A similar system relative to the system 100 of FIG. 1 can be configured as an end-on delivery system (mounted to a side wall of an enclosed space) instead of a roof-top system. Such a system can be a side-by-side unit with a sensible wheel and a DEC, in which the scavenger and process air streams can be side-by-side. Such side-by-side system can run in evaporation and economizer modes in a similar manner as described above with reference to the system 100 of FIG. 1. Additionally, such side-by-side system can exhibit similar characteristics or operate according to similar parameters as those described above with reference to the system 100 of FIG. 1.

Figure 2:
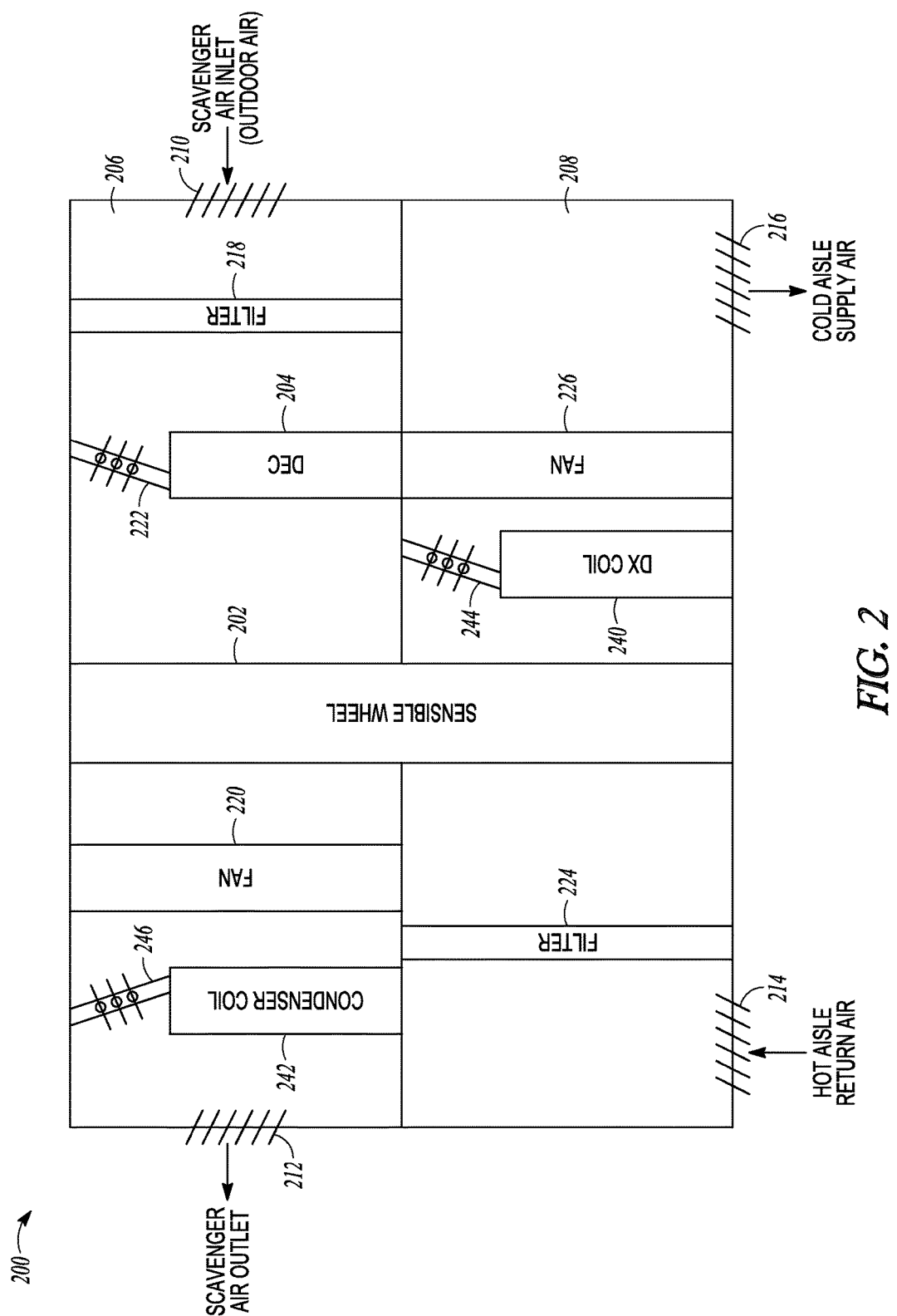
FIG. 2 is a schematic of an example roof-top system in accordance with the present patent application.

FIG. 2 depicts an example roof-top system 200 and, similar to the system 100, can include top 206 and bottom 208 levels, a sensible wheel 202 and a DEC 204. The system 200 can operate in an economizer mode and an evaporation mode, similar to FIG. 1. Scavenger or outside air can pass through the top level 206 through a scavenger air inlet 210 and outlet 212. Process air can pass through the bottom level 208 through a process air inlet 214 and outlet 216. As similarly described above in reference to the system 100, the system 200 can include fans 220 and 226, as well as filters 218 and 224. As described in the context of the system 100, the system 200 can also be employed in an end-on delivery application.

Compared to the system 100, the system 200 can include a direct expansion (DX) coil 240 (an air cooled condenser) and a condenser coil 242 (described below). The DX coil 240 can provide additional cooling in the process air stream and can facilitate operation of the system 200 in a third mode referred to as an evaporation plus DX mode or a DX mode. The DX coil 240 is shown in FIG. 2 in the bottom level 208 between the sensible wheel 202 and the fan 226; it is recognized that the DX coil 240 can be located downstream of the fan 226.

Similar to the system 100, the scavenger air passes through the DEC 204 and is evaporatively cooled to its wet-bulb temperature. The cooled scavenger air then passes through the sensible wheel 202 and indirectly cools the process air in the bottom level 208 through sensible cooling. The process air exiting the sensible wheel 202 passes through the DX coil 240 for further cooling in the DX mode.

The DX mode can be used, for example, to meet a target temperature or set point for the process air exiting the outlet 216 when the cooling is not sufficient using the DEC 204 and the sensible wheel 202 in an evaporation mode. As described above, in some examples, the target temperature of the cold aisle supply air can be 75 degree Fahrenheit. If the system 200 is not able to cool the process air to the target temperature in the evaporation mode, even after making adjustments to the components of the system 200 (such as operating speeds), the system 200 can switch to the DX mode. Thus the selection of the mode can be controlled through the target temperature, or acceptable range, for the supply air. It is recognized that the target temperature or range can be adjusted by the user. In some examples, the operation of the system 200 can be based in part on the OADB and OAWB temperatures. Example temperatures provided above for the system 100 for the economizer and evaporation modes can also be applicable for those two modes in the system 200. In some examples, the DX mode may be employed in the system 200 if the OAWB temperature is greater than 66 degree Fahrenheit. In this mode, the sensible wheel 202 and the fan 220 may run at full speed.

Figure 3:
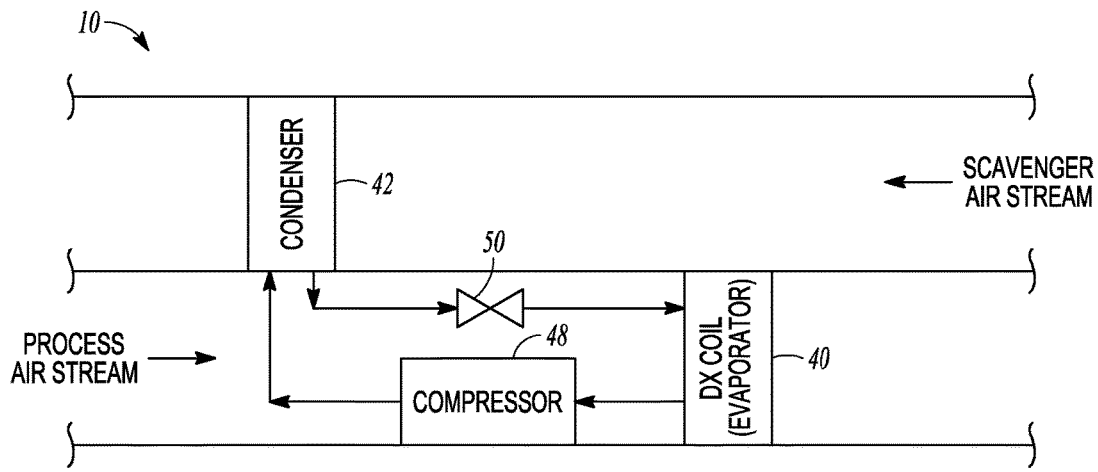
FIG. 3 is a schematic of an example direct expansion (DX) system for use in a roof-top or end-on delivery system in accordance with the present patent application.

The condenser coil 242 can be located in the top level 206 downstream of the sensible wheel 202 and the condenser coil 242 can be used in the DX mode. The scavenger air can pass through the condenser coil 242 to cool the refrigerant from the DX coil 240 in the bottom level 208. The cooling circuit for the DX coil 240 and the condenser coil 242 is not shown in FIG. 2, but an example of a similar cooling circuit is shown in FIG. 3. The scavenger air passing through the condenser coil 242 can reject heat from the refrigerant of the DX coil 240. The scavenger air can be exhausted to outside, through the scavenger air outlet 212, as warm and humid air. The cooled refrigerant exiting the condenser coil 242 can flow back into the DX coil 240. In the DX mode, a compressor speed (load) of a compressor (see FIG. 3) between the DX coil 240 and the condenser 242 may be controlled.

Similar to the system 100 of FIG. 1, the system 200 can include a bypass damper 222 that allows the scavenger air to enter the top level 206 without passing through the DEC 204. The scavenger air bypasses the DEC 204 in an economizer mode. The system 200 can also include a bypass damper 244 in the bottom level 208, which causes the process air to bypass the DX coil 240, and a bypass damper 246 in the top level 206, which causes the scavenger air to bypass the condenser coil 242. In the DX mode, the bypass dampers 222, 244 and 246 are closed, and the air inlets 210 and 214 are open.

In the evaporation mode, the system 200 can operate similarly to the system 100 in that the bypass damper 222 can be closed. However, unlike the system 100, the bypass dampers 244 and 246 can be open such that the process air in the bottom level 208 bypasses the DX coil 240 and the scavenger air in the top level 206 bypasses the condenser coil 242. In the economizer mode, the scavenger air inlet 210 can be closed and the scavenger air can enter the top level 206 through the bypass damper 222 and then bypass the condenser coil 242 after passing through the sensible wheel 202; the process air can enter the bottom level 208 and pass through the sensible wheel 202 and then bypass the DX coil 240.

As described above in reference to FIG. 1, the bypass damper 222 for the DEC 204 can be installed in a location in the top level 206 such that the scavenger air enters the bypass damper 222 in such a way, for example, downstream of the DEC 204, that the scavenger air essentially completely bypasses the DEC 204 (and the scavenger air inlet 110 is closed). In some examples, the bypass dampers 244 and 246 can be configured such that, when the bypass dampers 244 and 246 are open, the process air can physically still pass through the DX coil 240 and the scavenger air 242 can physically still pass through the condenser coil 242. However, in operation, the process air and scavenger air will take the flow path of less resistance and thus the majority of the air will pass through the dampers 244 and 246. It is recognized that some amount of air will pass through the DX coil 240 and the condenser coil 242. The lower pressure drop caused by the bypass of the DX coil 240 and the condenser coil 242 can increase an efficiency of the system 200.

Table 1 below lists a range of sensible effectiveness of the wheel 202 and the impact the sensible effectiveness has on the OADB temperature limit and the OAWB temperature limit, as well as overall wet bulb effectivess.

TABLE 1

| Wheel sensible effectiveness (%) | OADB limit for eonomizer mode (° F.)* | OAWB limit for evaporation mode (° F.)* | Unit wet bulb effectiveness (%)* |
|---|---|---|---|
| 70 | 63.5 | 61.8 | 67.3 |
| 72.5 | 64.8 | 63.2 | 69.7 |
| 75 | 66 | 64.5 | 72.1 |
| 77.5 | 67.2 | 65.8 | 74.5 |
| 80 | 68.3 | 66.9 | 77 |
| 82.5 | 69.3 | 67.9 | 79.3 |
| 85 | 70.2 | 68.9 | 81.7 |

The values in Table 1 assume a 95% effective evaporative cooler, cold aisle supply temperature target of 75° F., and hot aisle return temperature of 102° F. (including a 2° F. temperature increase due to fans).

The unit wet bulb effectiveness shown in Table 1 represents an overall effectiveness of the system 200 for cooling the process air stream down to a dry bulb temperature that is the same as the outdoor air wet bulb (OAWB) temperature. The calculation for unit wet bulb effectiveness is shown in Equation 1 below.

$$\text{wet bulb effectiveness} = \frac{(mcp)\text{process}(THotaisle - TColdaisle)}{(mcp)\min(THotaisle - TOAWB)} \times 100 \qquad \text{Equation 1}$$

In Equation 1, mcp is the product of the mass flow rate of air and the specific heat of the air. In the numerator, mcp of the process air is used. In the denominator, the (mcp)min is the smaller of the mcp of the process air and the mcp of the scavenger air. In the numerator, the mcp of the process air is multiplied by the temperature difference between the process air at the inlet 114 (THotaisle) and the process air at the outlet 116 (TColdaisle). In the denominator, the mcp of either the process air or the scavenger air is multiplied by the temperature difference between the process air at the inlet 114 (THotaisle) and the outdoor air wet bulb (OAWB).

A unit wet bulb effectiveness of 100% means that the dry bulb temperature of the supply air (leaving the bottom level 200 at the outlet 216) is equal to the outdoor air wet bulb (OAWB) temperature. This is not possible given that there will be some inefficiency in the equipment, such as the sensible wheel 202 or the DEC 204.

FIG. 3 depicts an example DX system 10 that can be included in a roof-top or end-on delivery system like the system 200 of FIG. 2. The DX system can be used in other roof-top or end-on delivery systems described herein. The system 200 of FIG. 2 included the DX coil 240 and the condenser coil 242 but did not show the additional components of the cooling circuit of the DX system 10 which are included in FIG. 3. The DX system 10 can include a DX coil 40, similar to the DX coil 240, which can be located in a process air stream. In some cases, there may not be condensation on the DX coil 40. In some examples, a microchannel DX coil can be used in the system of FIG. 3.

The DX system 10 can also include a condenser 42, similar to the condenser 242, which can be located in a scavenger air stream. The refrigerant from the DX coil 40 can exit the DX coil 40 and flow through a compressor 48 and then through the condenser 42. The scavenger air passing through the condenser 42 can cool the refrigerant. After exiting the condenser 42, the refrigerant can flow through an expansion valve 50 (for controlling the refrigerant) before flowing back to the DX coil 40.

When a system, like the system 200 of FIG. 2, uses the DX system 10, it is because additional cooling is needed or beneficial, beyond the cooling provided by a DEC and an AAHX, such as a sensible wheel. It is recognized that the cooling capacity provided by the DX system 10 can be modulated and change based on the needs of the DX system 10. It may not be necessary to operate the DX system 10 at full capacity and the operation can vary across a cooling range rather than operating the DX system 10 in only active or inactive modes.

FIG. 4 depicts an example direct evaporative cooler (DEC) 60 that can be included in a roof-top or end on delivery system and may be similar to the DECs 104 and 204 in the systems 100 and 200, respectively, described above. The DEC 60 can also be used in the other roof-top or end on delivery systems described herein. The DEC 60 can include an evaporation media 62, a mist eliminator 63, a water collection pan/tank 64, a water sprayer 65 and a water treatment unit 66. The scavenger air or outdoor air can pass through the evaporation media 62 which is wetted with water from the sprayer 65. In some examples, the evaporation media can include fiberglass, but other materials can be used in the alternative or in addition to fiberglass. As the air passes through the media 62, the water evaporates into the air which results in cooling. The cooled air can pass through the mist eliminator 63 to remove liquid droplets from the air. As described above, the cooled air exiting the DEC 60 can then pass through a sensible wheel to reject heat from the process air.

Excess water from the evaporation media 62 can be collected in the collection pan/tank 64 and then recirculated back to the water sprayer 65. The water can pass through an optional water treatment unit 66 located before the water sprayer 65. Make-up water can be supplied to the collection pan/tank 64 and a purge can periodically be performed.

It is recognized that other types of direct evaporative coolers can be used in the roof-top and end-on delivery systems described and shown herein.

Figure 5:
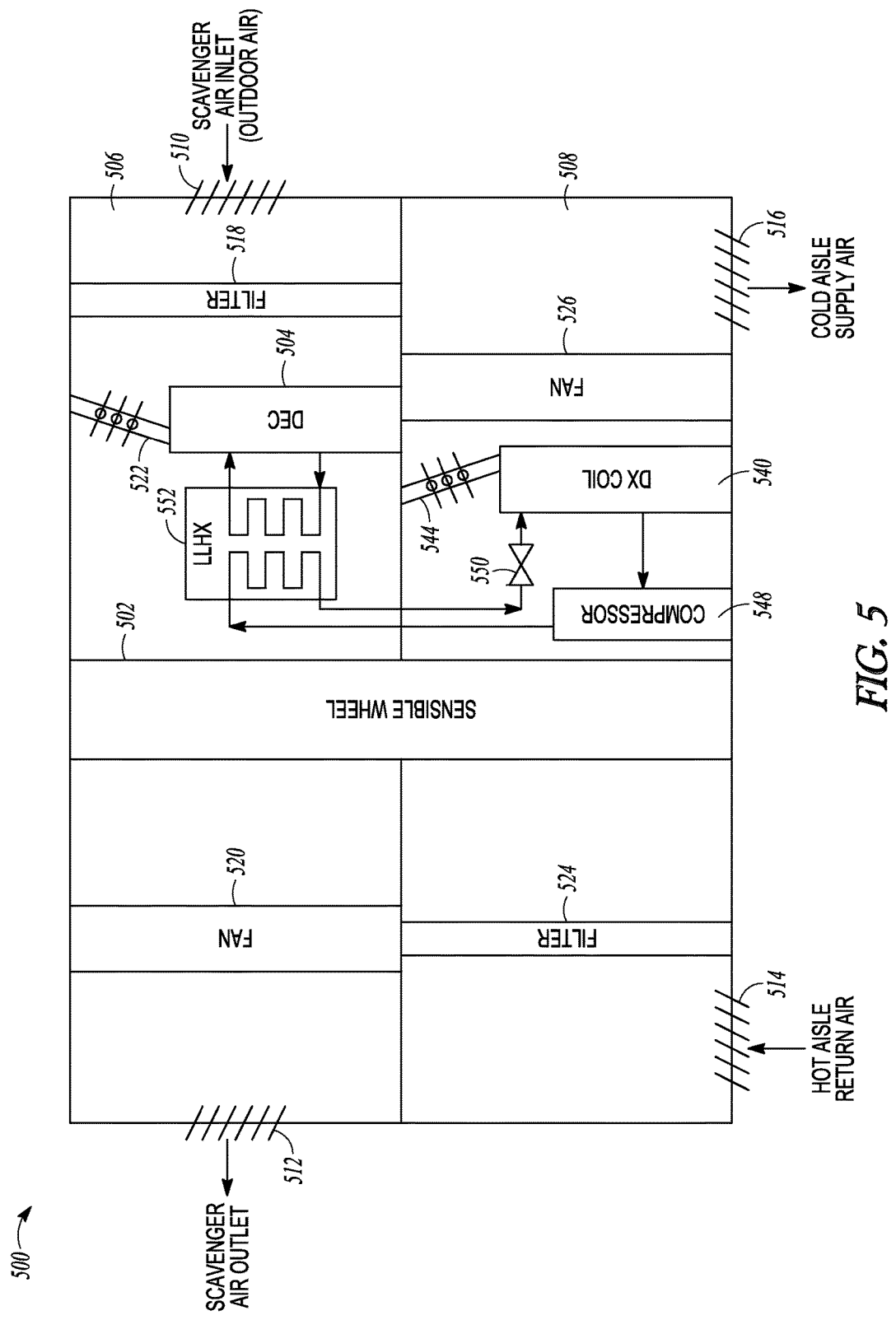
FIG. 5 is a schematic of an example roof-top system in accordance with the present patent application.

FIG. 5 depicts an example roof-top system 500 that is similar to the systems 100 and 200 of FIGS. 1 and 2 and can include several of the same components. The system 500 can also be employed in an end-on delivery application. In addition to the components shown in the system 200 of FIG. 2, the system 500 can include a liquid-to-liquid heat exchanger (LLHX) 552, or water cooled condenser, in a top level 506. A compressor 548 is shown in the bottom level 508. The system 500 includes a DEC 504 and a DX coil 540, similar to the system 200 of FIG. 2. The LLHX 552 can be used to cool the DX refrigerant of the DX coil 540 using cool water supplied from the DEC 504. The system 500 can include a bypass damper 522 for bypassing the DEC 504 and a bypass damper 544 for bypassing the DX coil 540.

As with other disclosed examples, the system 500 of FIG. 5 can operate in multiple modes. In an economizer mode, the bypass dampers 522 and 544 are open, the DEC 504 is disabled and the scavenger and process air flow is similar to that described for the economizer mode of the system 100 of FIG. 1. The system 500 of FIG. 5 can also operate in an evaporation mode, in which the bypass damper 522 is closed, the bypass damper 544 is open, and the scavenger and process air flow is similar to that described for the evaporation mode of the system 100 of FIG. 1. In a DX mode, the bypass dampers 522 and 544 are closed, the scavenger air flows through the top level 506 from the scavenger air inlet 510 to the outlet 512, and the process air flows through the bottom level 508 from the process air inlet 514 to the outlet 516.

The system 500 includes a water loop that can be used for additional cooling. Water flows over the media of the DEC 504 (see FIG. 4) and evaporates to cool the scavenger air passing through the top level 506. Both the scavenger air and the water can be cooled to the OAWB temperature. The cooled water, which can be collected in a collection pan/water tank (not shown in FIG. 5, see FIG. 4), flows into the LLHX 552 (water cooled condenser) and cools the refrigerant. (The water in the collection pan can be the coldest water within the DEC 504.) The cooled/condensed refrigerant flows from the LLHX 552, through an expansion value 550 for refrigerant control, and into the DX coil 540 in the bottom level 508 to reject heat from the process air flowing through the bottom level 508. After exiting the DX coil 540, the refrigerant can flow through a compressor 548 prior to returning to the LLHX 552.

After passing through the LLHX 552, the water can flow back to the DEC 504. In one example, the water, which is now warm, can go directly back to the sprayer at the top of the DEC 504, rather than back to the collection pan.

Although the LLHX 552 is shown in FIG. 5 as being downstream of the DEC 504, the LLHX 552 does not have to be configured as shown. In some examples, a water piping circuit can be located around or in proximity to the DEC 504 and the LLHX 552 can be within the circuit. In other examples, the LLHX 552 can be in the collection pan of the DEC 504, and the warm water exiting the LLHX 552 can get pumped back to the sprayer at the top of the DEC 504.

In summary, in the system 500, the cold water in the DEC 504 can be used to cool the refrigerant from the DX coil 540, using the LLHX 552. The cooled refrigerant flows back to the DX coil 540 in the bottom level and cools the process air flowing through the DX coil 540 in the bottom level 508.

The system of FIG. 5 may provide a number of advantages. Water cooled condensers, such as the LLHX 552 shown in FIG. 5, may be operated with improved efficiency over air cooled condensers. The warm water coming from the LLHX 552 can function to boost the evaporation potential of the DEC 504. Additionally, the system 500 may have a reduced pressure drop on the scavenger air side (the top level 506), as compared to the system 200 of FIG. 2, given the LLHX 552 and the elimination of an air cooled condenser (such as the condenser coil 242 of FIG. 2).

Figure 6:
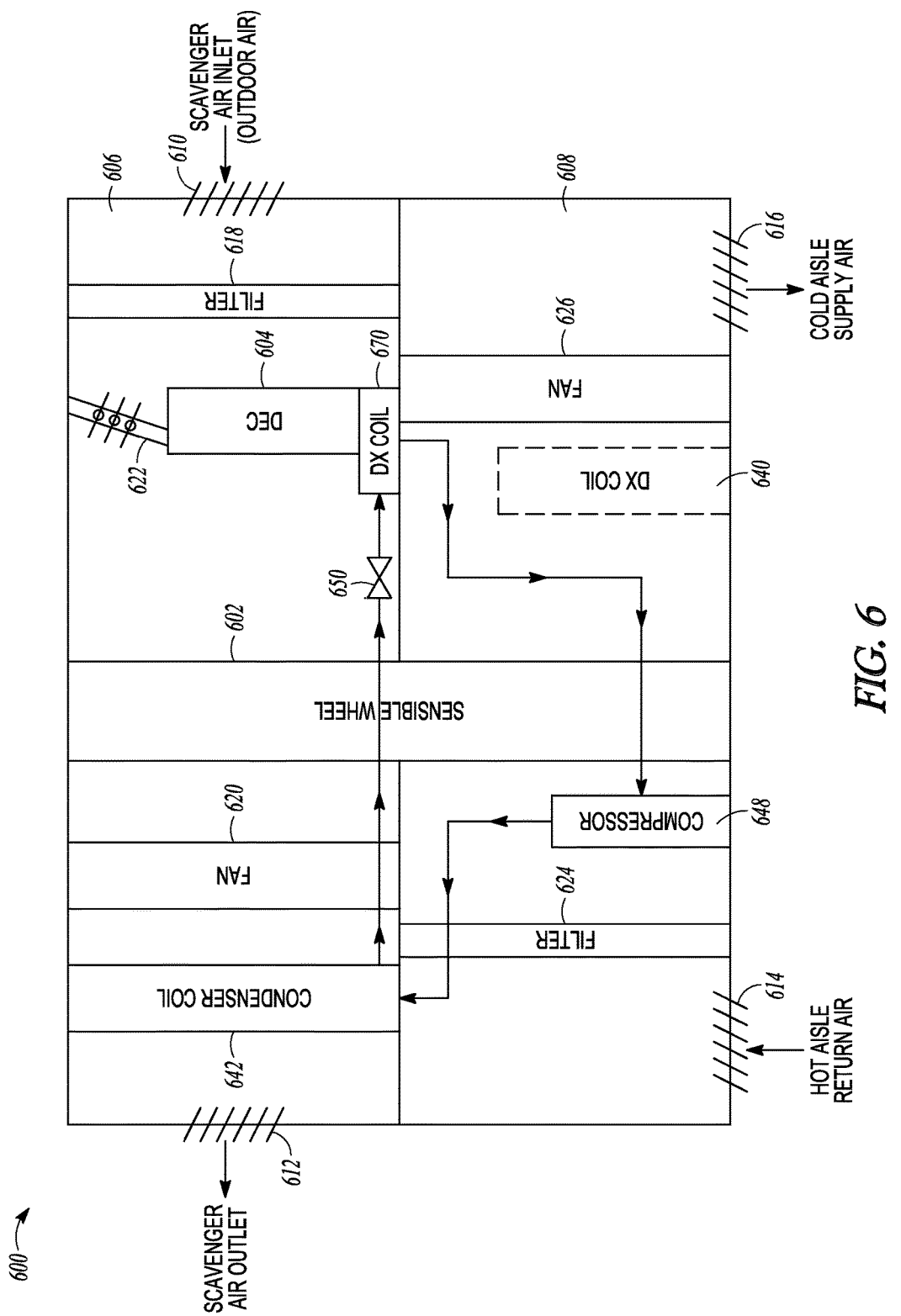
FIG. 6 is a schematic of an example roof-top system in accordance with the present patent application.

FIG. 6 depicts an example system 600 for roof-top or end-on delivery applications. The system 600 can be similar to the system 500 and include many of the same components, including a DEC 604 and a wheel 602. In contrast to the system 500, the system 600 can exclude a LLHX in the top level 606. The system 600 can operate in the three modes described above—an economizer mode, an evaporation mode, and a DX mode (evaporation plus DX). The system 600 can include a DX coil 670, which can be located in the DEC 604. A DX coil 640 (similar to DX coil 240 and 540 of the systems 200 and 500, respectively) is shown in dotted lines in FIG. 6 and can optionally be included within the system 600. The DX coil 640 is described in further detail below.

The DX coil 670 can cool water inside the water collection pan/water tank (not shown in FIG. 6, see FIG. 4) of the DEC 604 below the outdoor air wet bulb temperature, when the system 600 is running in the DX mode. As described above, the DX mode can be used if cooling from the DEC 604 and the sensible wheel 602 is not sufficient, based, for example, on a set point or range for the process supply air returned to the enclosed space. Instead of having a DX coil in the process air stream of the bottom level 608 (as shown in FIGS. 2 and 5), the DX coil 670 can be in the DEC 604 of the scavenger air stream.

As a result of the DX coil 670, the cold water in the DEC 604 can be cooled down further and the DEC 604 can provide additional cooling for use in indirectly cooling the process air in the sensible wheel 602.

As shown in FIG. 6, water exiting the DX coil 670 can flow to a compressor 648 in the process air stream and to a condenser coil 642 in the scavenger air stream. The water can then flow through an expansion valve 650 prior to returning to the DX coil 670 in the DEC 604. It is recognized that the compressor 648 can be located within a different location within the system 600. A particular location selected can depend, in part, on space availability or installation costs.

The cooling water loop or circuit in the system 600 can be the same as the cooling water loop in the system 500, except that in the system 600, the water can flow through a condenser coil instead of the LLHX 552. A size and shape of the water collection pan may be different to accommodate the DX coil 670 in the DEC 604.

In some examples, the system 600 can remove the DX coil from the process airstream (as shown in FIGS. 2 and 5), and the process air stream flowing through the bottom unit 608 can have a reduced pressure drop which can increase the efficiency of the system 600. It is estimated that the process side pressure drop will decrease by 15% to 20% by removing the DX coil from the bottom level 608.

As similarly shown in FIG. 2, the condenser coil 642 can be located in the scavenger air steam. In another example, the condenser coil can be a separate module located outside of the scavenger air flow path. In one example, the condenser coil can be mounted external to the system 600. Removing the condenser coil 642 from the top level 606 can eliminate the pressure drop of the condenser coil when the system 600 is running in the economizer and evaporator modes and not using a DX coil. A condenser coil module separate from the system 600 may add additional costs and take up extra space.

In the event of a water outage or reduction, the DEC 604 and the DX coil 670 could be out of order or limited significantly. As such, the cooling potential from both the DEC 604 and the DX coil 607 could be eliminated or compromised. In one example, the system 600 can include the DX coil 640 in the bottom level 608, which can be present in addition to the DX coil 670 in the DEC 604. The DX coil 640 can be used to reject some of the heat from the process air stream, if there was a water failure that discontinued or significantly limited use of the DEC 604 and the DX coil 670. Thus the DX coil 640 can act as a back-up to the DEC 604 and the DX coil 670. In one example, both the DX coil 670 and the DX coil 640 can be used simultaneously during operation of the system 600. One or both of the DX coils 640 and 670 can have an overall smaller size and capacity. Both DX coils 640 and 670 can be used simultaneously, for example, at a peak cooling load.

Figure 7:
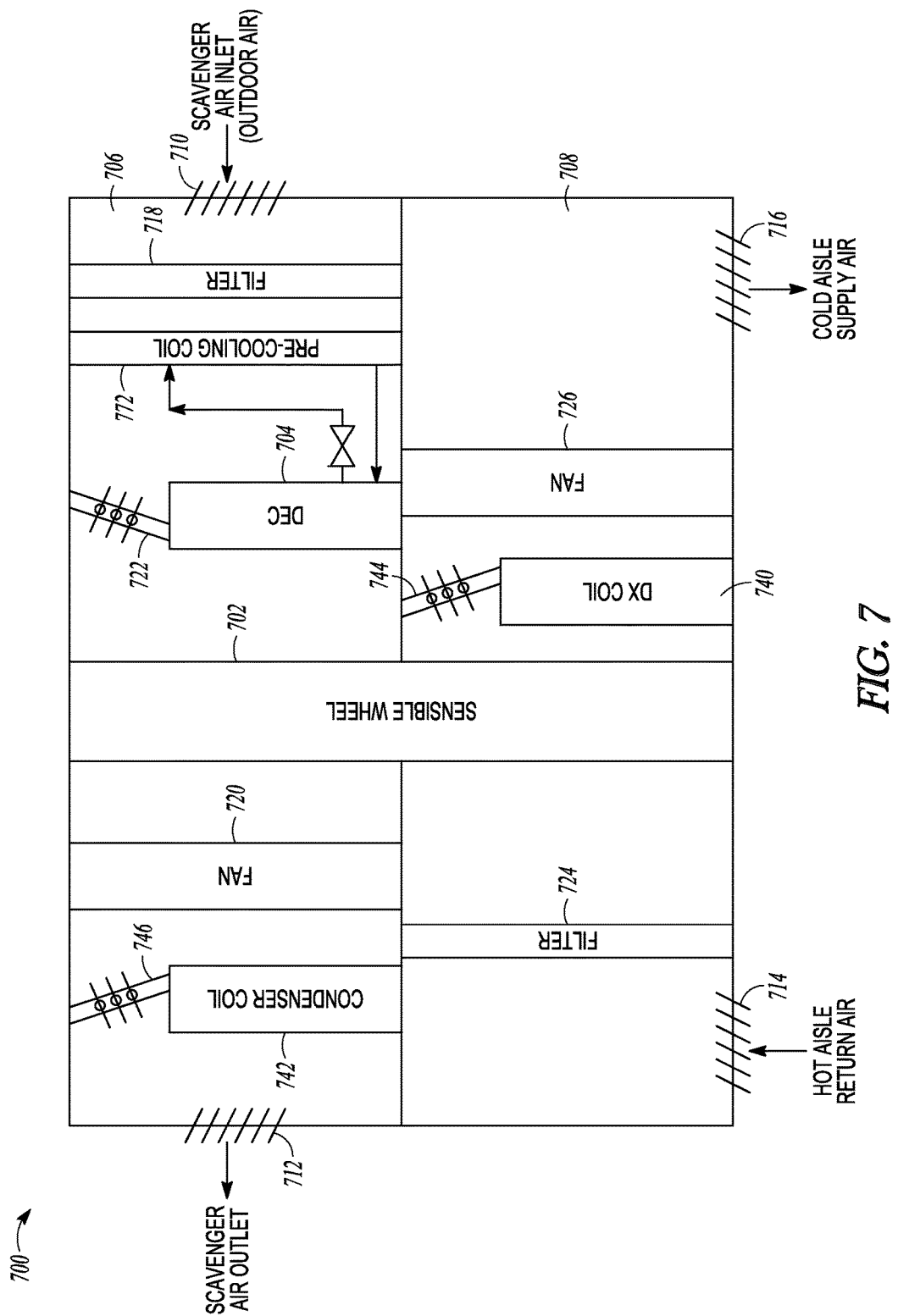
FIG. 7 is a schematic of an example roof-top system in accordance with the present patent application.

FIG. 7 depicts an example system 700 for roof-top or end-on delivery applications and can be similar to the system 200 of FIG. 2 and include many of the same components, including a DEC 704 and a wheel 702. The system 700 can operate in the three modes described above. In contrast to the system 200, the system 700 can include a pre-cooling coil 772 upstream of the DEC 704 in the top level 706.

The precooling coil 772 may function to depress the outdoor air wet-bulb (OAWB) temperature when the scavenger or outdoor air entering the top unit 706 through the scavenger air inlet 710 is hot and humid and permit the system 700 to cover substantially all of the load of the data center (or other enclosed space the system 700 is providing cooling to) with evaporative cooling at higher OAWB temperatures. In other words, raising the OAWB limit permits the system 700 to operate in the evaporation mode, without DX cooling, across a wider range of conditions. The system 700 can increase the evaporation potential in the DEC 704.

The system 700 may be run in an economizer mode similar to that described above with reference to FIG. 2 with the bypass dampers 722, 744 and 746 open and the air inlets 708 and 710 closed. In the economizer mode, the scavenger air bypasses the pre-cooling coil 772, the DEC 704 and the condenser coil 742, and the process air bypasses the DX coil 740.

The system 700 may be run in an evaporation mode and a DX mode (evaporation plus DX mode). In those modes, the outdoor air (scavenger air) enters the top level 706 through the scavenger air inlet 710 and passes through the pre-cooling coil 772 which can sensibly cool the outdoor air and depress its wet bulb temperature; the scavenger air can then pass through the DEC 704 which can cool the scavenger air to its wet bulb temperature (the scavenger air new wet bulb temperature is now different (lower) than the outdoor air wet bulb temperature). The scavenger air can next pass through the sensible wheel 702 and indirectly cool the data center air.

In the evaporation mode, the bypass damper 722 can be closed and the other bypass dampers 744 and 746 can be open. As such, the scavenger air bypasses the condenser coil 742 in the top level 706 and the process air bypasses the DX coil 740 in the bottom level 708.

In the evaporation plus DX mode, the bypass dampers 722, 744, and 746 can all be closed. As such, the scavenger air passes through the condenser coil 742 and the process air passes through the DX coil 740 for additional cooling. Determining which mode the system operates in can be based on similar parameters and conditions as described above in reference to the systems 100 and 200 of FIGS. 1 and 2.

With reference to the water loop included in the system 700 between the DEC 704 and the pre-cooling coil 772, the water in the collection pan/tank (not shown in FIG. 7, see FIG. 4) of the DEC 704 can flow into the pre-cooling coil 772 and collect heat from the scavenger air passing through the pre-cooling coil 772. The warm water can be returned to the collection pan/tank. The water can be sprayed on the evaporation media as described above in reference to FIG. 4 and evaporate. The evaporation process can cool the scavenger air to its wet bulb temperature.

Figure 8:
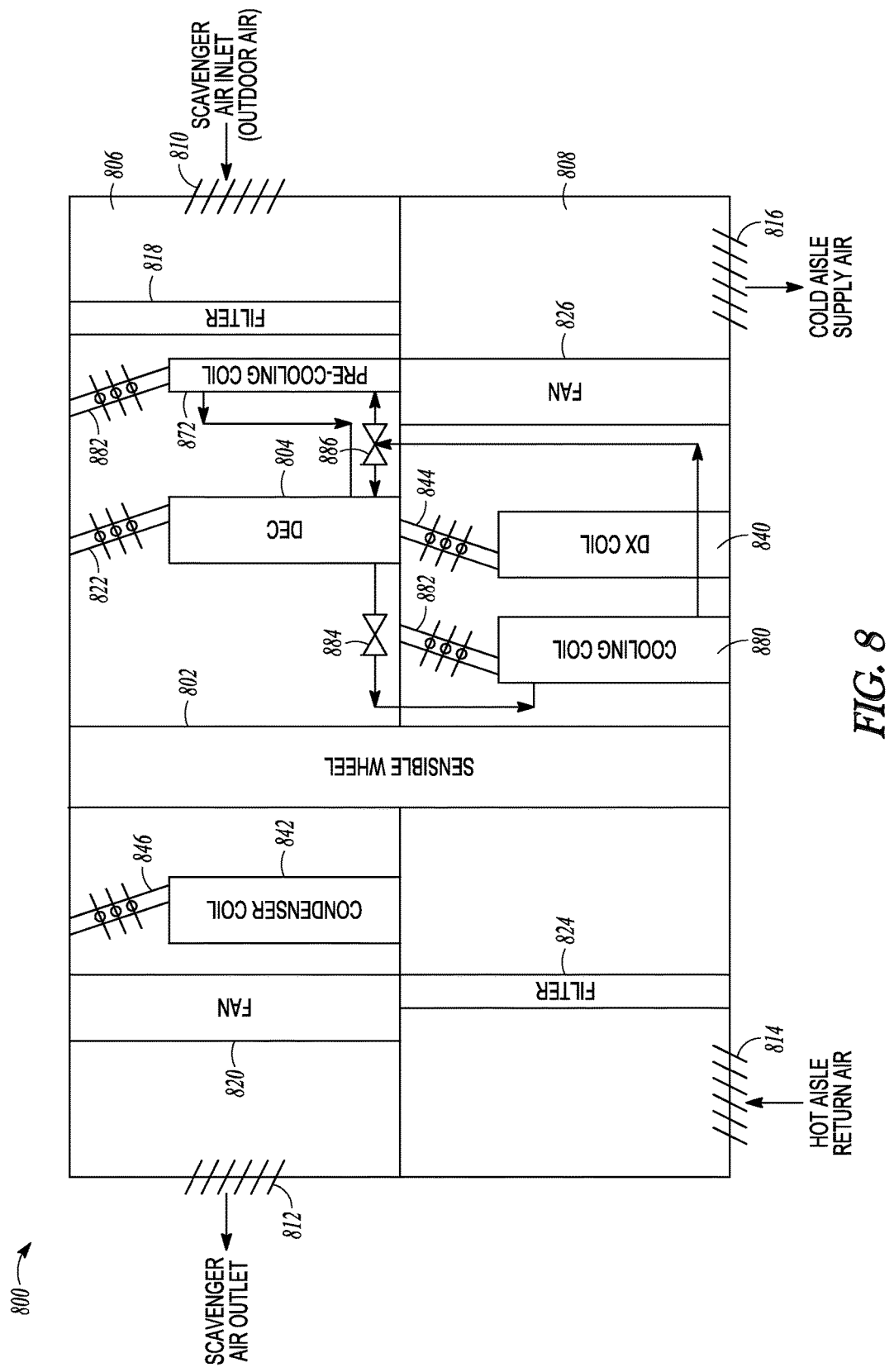
FIG. 8 is a schematic of an example roof-top system in accordance with the present patent application.

FIG. 8 depicts an example system 800 for roof-top or end-on delivery applications and can be similar to the system 700 of FIG. 7. The system 800 can operate in the three modes described above. In contrast to the system 700, the system 800 can include a cooling coil 880 in the bottom level 808 between the sensible wheel 802 and the DX coil 840, and a bypass damper 882 in the top level 806 configured to allow the scavenger air to bypass the pre-cooling coil 872. As shown in FIG. 8, the fan 820 can be located downstream of the condenser coil 842, which is opposite to the configuration in the system 700. It is recognized that any of the systems described herein and shown in the figures could have the fan and condenser coil in either order in the scavenger air flow path. In some examples, the condenser coil 642 can alternatively be located upstream of the fan 620 such that the condenser coil 642 does not have to deal with the added heat from the electrical energy of the fan 620.

The cooling coil 880 may function to cool the process air after the sensible wheel 802 using the cold water in the DEC 804. This can increase the evaporation potential in the DEC 804 since a temperature increase of the water, from the cooling coil 880, can boost the evaporation in the DEC 804. The pre-cooling coil 872 can provide pre-cooling or pre-heating. In hot and humid climates, the pre-cooling cool 872 can function to depress the outdoor air wet bulb temperature and increase the evaporation potential in the DEC 804. In moderate outdoor air temperatures with relatively high humidity, the pre-cooling coil 872 can heat the outdoor air entering the inlet 810 to increase the evaporation potential in the DEC 804.

The economizer mode of the system 800 can be substantially similar to the economizer mode described with reference to the systems 100 and 200.

In the evaporation mode, the DX and condenser bypass dampers 844 and 846 can be open and the other bypass dampers 822 and 882 can be closed. However, the pre-cooling coil 872 can be bypassed, using bypass damper 882, in hot and humid conditions when the OADB temperature is lower than the water temperature entering the pre-cooling coil 872. Operation with regard to the scavenger air in the top level 806 may be substantially similar to the system 700 of FIG. 7. Operation with regard to the process air in the bottom level 808 may be substantially similar to the system 700, except that the process air can also pass through the cooling coil 880. Additionally, the cooling coil 800 may provide extra cooling to the process air, reduced the cooling needed from the DX coil 840, and increase the evaporation potential in the DEC 804.

In the DX mode (evaporation plus DX), all of the bypass dampers 822, 842, 846 and 882 can be closed. However, the pre-cooling coil 872 can be bypassed, using bypass damper 882, in hot and humid conditions when the OADB temperature is lower than the water temperature entering the pre-cooling coil 872. Operation with regard to the scavenger air in the DX mode may be substantially similar to the system 700. Operation with regard to the process air in the DX mode may be substantially similar to the system 700, except that the process air will be cooled in three stages (sensibly): the sensible wheel 802, the cooling coil 880, and the DX coil 840.

The system 800 can include a water loop that facilitates operation of the system 800 as described above. The water from the DEC 804 can flow through an expansion valve 884 and through the cooling coil 880. The water can then pass into a diverter valve 886, which can direct the water either back to the DEC 804 or to the pre-cooling coil 872. If the water is directed to the pre-cooling coil 872, the water exiting the pre-cooling coil 872 can then flow back to the DEC 804.

In the economizer mode, the water loop may be closed since the DEC 804 and the cooling coil 880 are not being utilized. The water loop may be active in the evaporation and DX modes. In some cases, when active, the water is sprayed on the DEC media (see FIG. 4) in the DEC 804 and the water is cooled to the wet bulb temperature of the scavenger air passing through the DEC 804. The cold water then passes through the cooling coil 880 in the bottom level 808 to further cool the process air exiting the sensible wheel 802. As a result, the temperature of the water increases. If the temperature of the water at the outlet of the cooling coil 880 is higher than the OADB temperature in hot and humid climates, then the water flows to the water collection pan/tank in the DEC 804 and bypasses the pre-cooling coil 872 through the use of diverter valve 886. Otherwise, the water flows from the cooling coil 880 to the pre-cooling coil 872 to depress the OAWB temperature. The pre-cooling coil 872 causes the temperature of the water to increase again. The water flows back into the collection pan/tank of the DEC 804 and the cycle continues. The pre-cooling coil 872 acts as a preheating coil in moderate climates to heat the outdoor air and increase the evaporation potential in the DEC 804.

Figure 9B:
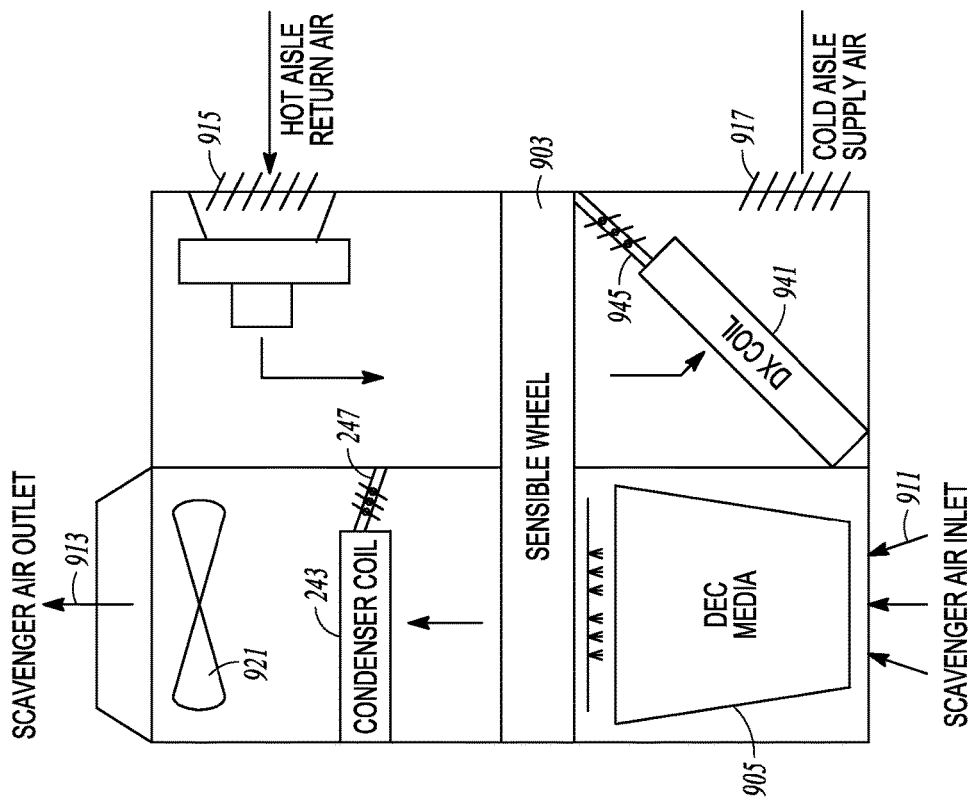
FIG. 9B is a schematic of a side view of the end-on delivery system in FIG. 9A.
Figure 9A:
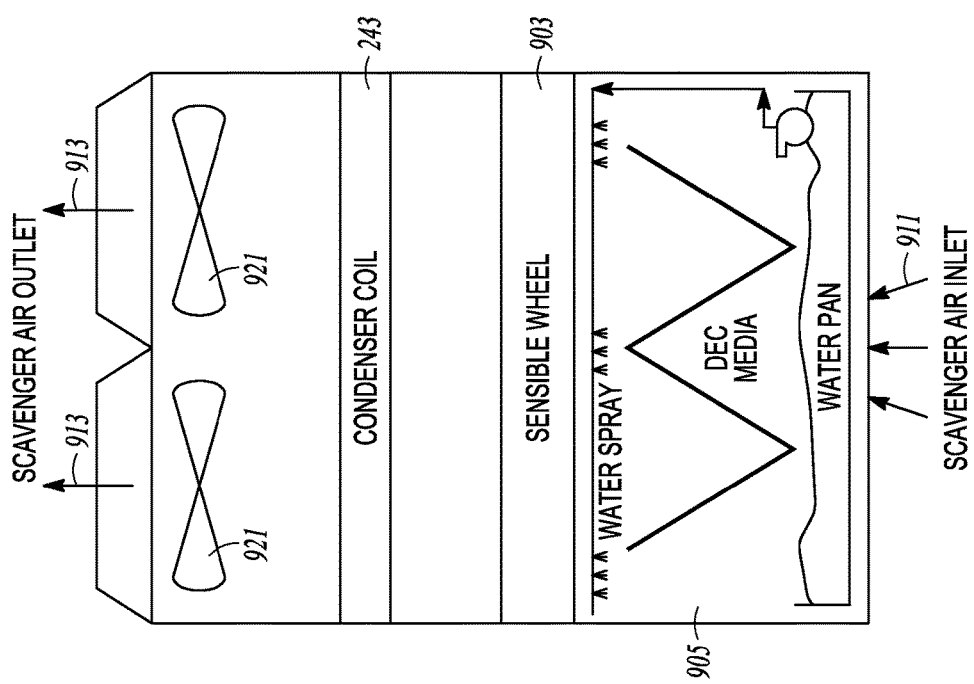
FIG. 9A is a schematic of an end view of an example end-on delivery system in accordance with the present patent application.

FIGS. 9A and 9B depict an example end-on delivery system 900 including a horizontally mounted sensible wheel 903 and a DEC 905. FIG. 9A is an end view of the system 900 and shows a scavenger air side of the system 900. The opposite end of the system 900 (not shown) is a process air side. FIG. 9B is a side view of the system 900 and shows the scavenger and process air flowing in generally opposite directions relative to one another. As described above in reference to the roof-top delivery systems, in an example, the process air can come from a data center in the form of hot aisle return air and then be returned to the data center as cold aisle supply air.

As similarly described above in reference to the roof-top delivery systems, the system 900 can include a partition separating the scavenger air side of the system 900 from the process air side of the system 900. As such, the scavenger air flow path and the process air flow path can remain separate from one another in the system 900. The sensible wheel 903 can span or be disposed in both the scavenger air side and the process air side.

The system 900 of FIGS. 9A and 9B may allow for a more compact unit than one including a vertically mounted sensible wheel. An air cooled condenser, such as condenser coil 243, can be used in the system 900. The system 900 can include the three modes described above—economizer, evaporation, and evaporation plus DX. Operation of the system 900 for all operating modes can be substantially similar to those described above with reference to the system 200 of FIG. 2. It is recognized that an end-on delivery system similar to the system 900 could be modified to include additional components shown and described above for roof-top systems, such as for example, fans, filters, liquid-to-liquid heat exchangers, a DEC with a DX coil located therein, pre-cooling coils, etc.

Figure 10:
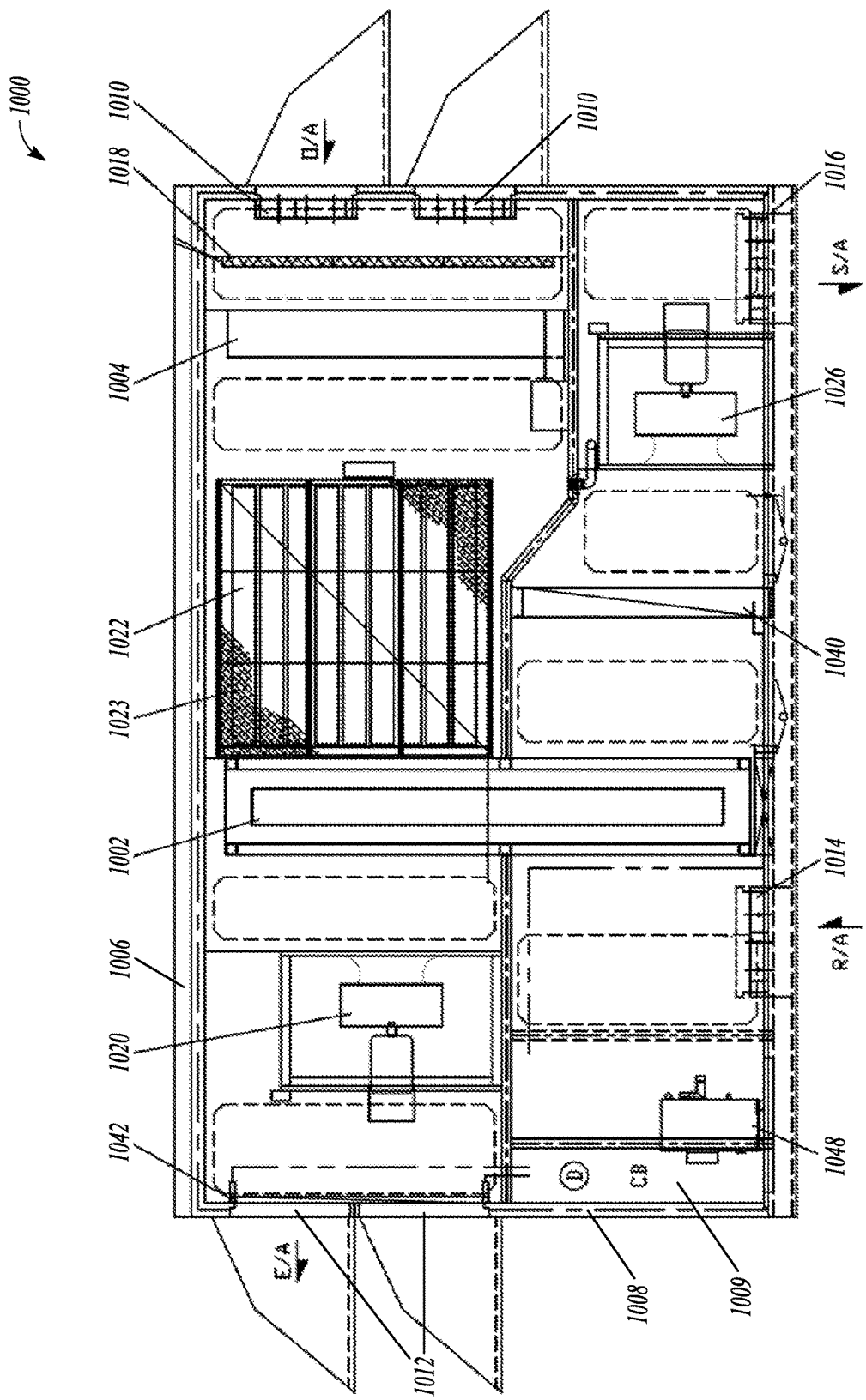
FIG. 10 is a side view of an example roof-top system in accordance with the present patent application.
Figure 11:
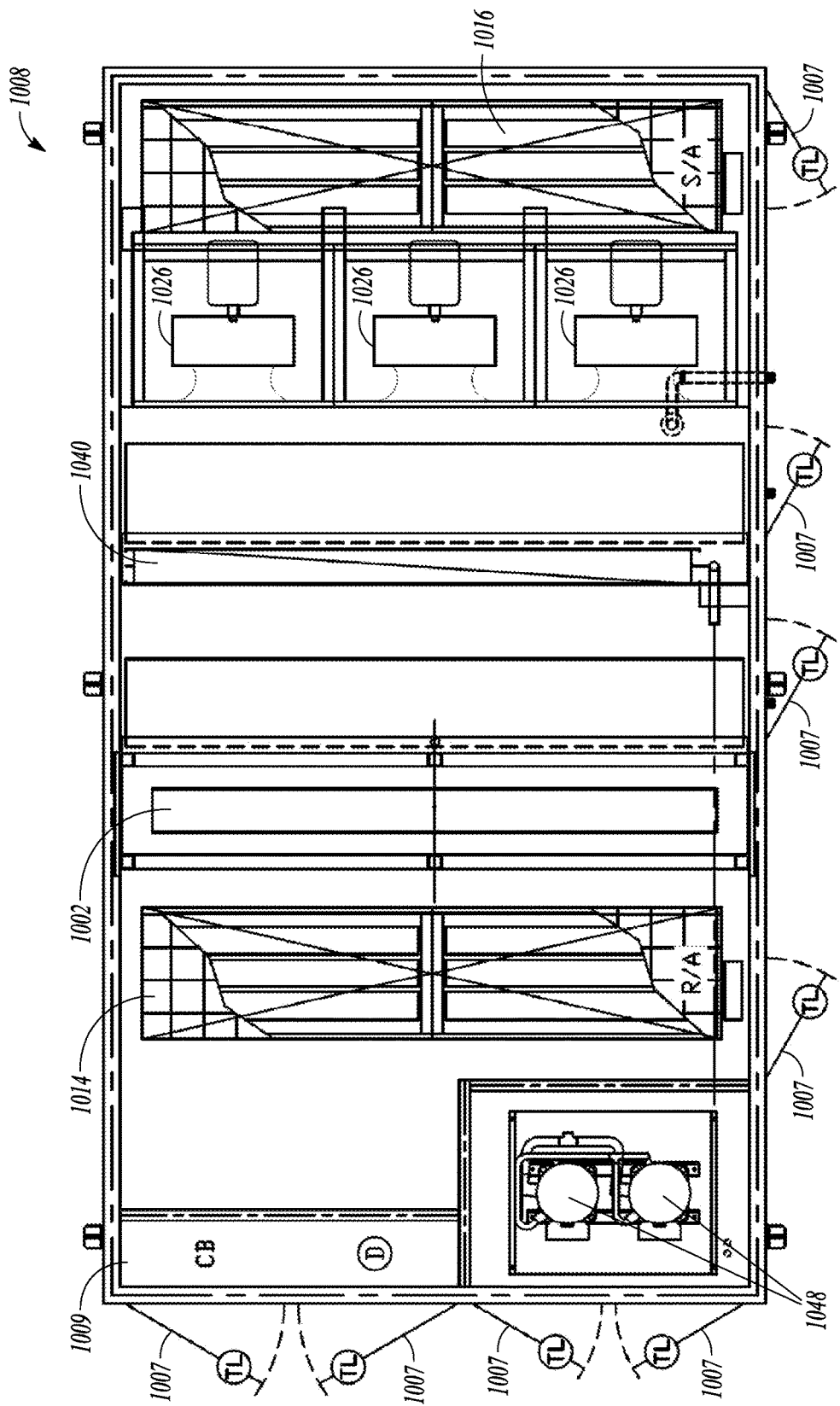
FIG. 11 is a schematic of a bottom view of the roof-top system of FIG. 10.
Figure 12:
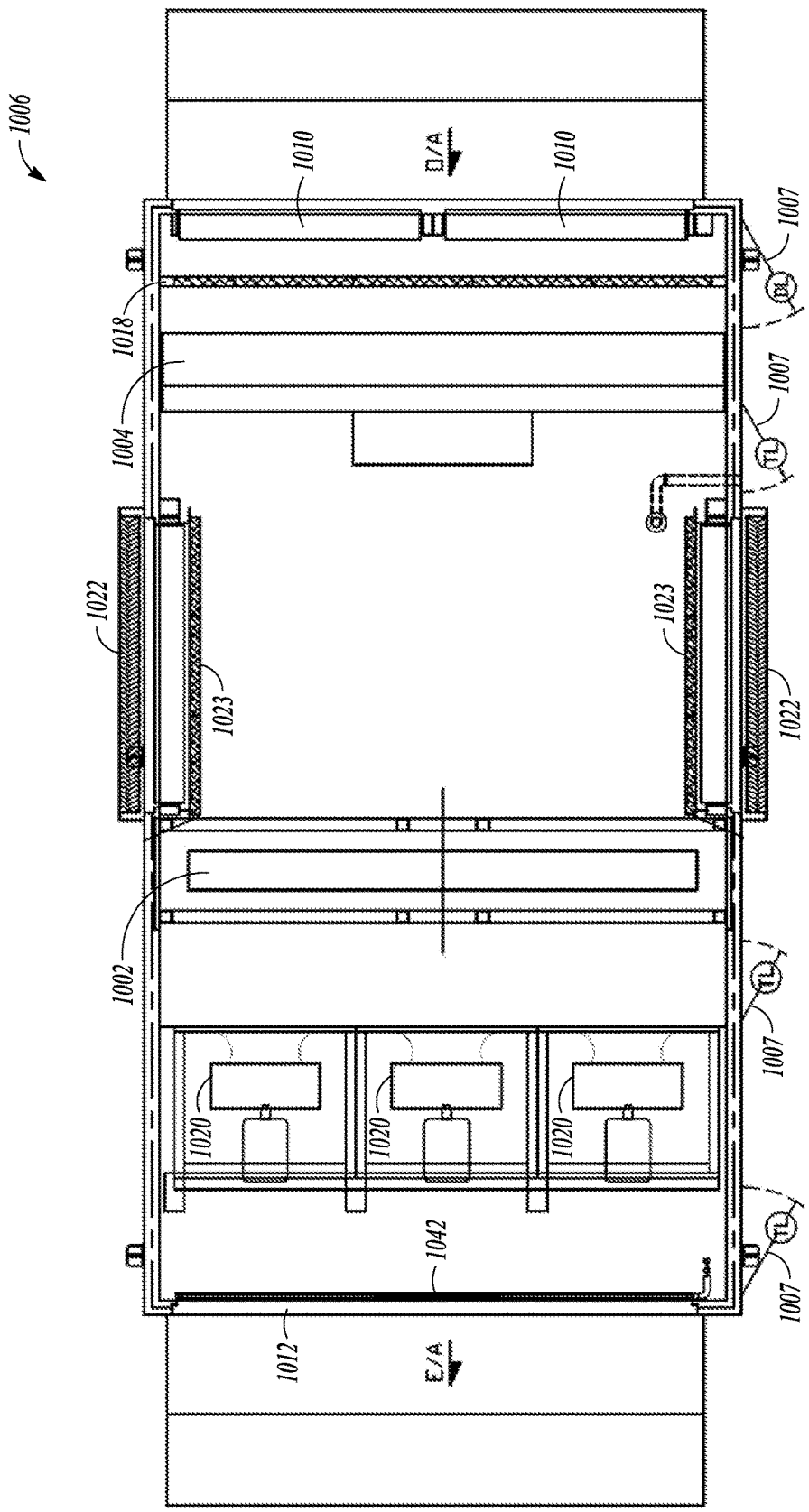
FIG. 12 is a schematic of a top view of the roof-top system of FIG. 10.

FIGS. 10-12 depict an example of a roof-top system 1000, which can similarly be employed in an end-on delivery application. The system 1000 may operate in a manner substantially similar to the system 200 of FIG. 2. However, the system 1000 as shown in FIGS. 10-12 provides additional detail, as compared to FIG. 2, with respect to arrangement, number, and configuration of different components of the example system. It is recognized that other roof-top and end-on delivery systems are included within the scope of the present application despite having different arrangements of components and different numbers of components, as compared to the system as specifically shown in FIGS. 10-12 and the other systems shown and described herein.

FIG. 10 is a side view of the system 1000 including a top level 1006 and a bottom level 1008. Outside area (O/A) or scavenger air enters the top level 1006 through a scavenger air inlet 1010, passes through a filter 1018, and through a DEC 1004. The scavenger air then passes through a sensible wheel 1002 and then a fan 1020 is located upstream of a condenser coil 1042. After passing through the condenser coil 1042, the scavenger air returns to the outside as exhaust air (E/A). In an economizer mode, the air inlet 1010 is closed and the scavenger air enters the top level 1006 through bypass damper 1022 and passes through a filter 1023, and then flows through the sensible wheel 1002.

Return air (R/A) or process air, from a data center or other enclosed space, enters the bottom level 1008 through a process air inlet 1014, passes through the sensible wheel 1002 and then passes through a DX coil 1040. A fan 1026 is located upstream of the DX coil 1040. The process air then exits the bottom level 1008 through a process air outlet 1016 as supply air (S/A). Also shown in the bottom level 1008 are one or more compressors 1048 and a control box 1009.

FIG. 11 is a bottom view of the system 1000 of FIG. 10 and illustrates the various components in the bottom level 1008. In one example, two compressors 1048 are shown in the bottom level 1008, although it is recognized that more or less compressors can be used. In one example, three fans 1026 are shown in the bottom level 1008, although it is recognized that more or less fans can be used. FIG. 11 illustrates various access doors 1007 on the bottom level 1008. A filter for the return air (process air entering the bottom level 1008 at the inlet 1014), although not shown in FIGS. 10 and 11, can be included in the system 1000, as shown in earlier figures—for example, the filter 124 in FIG. 1. Such filter for the return air can be similar to the filter 1018 in the top level 1006.

FIG. 12 is a top view of the system 1000 and illustrates the various components in the top level 1006. The bypass dampers 1022 and filters 1023 are better shown in FIG. 12 and allow the scavenger air to enter the top level 1006 downstream of the DEC 1004 and bypass the DEC 1004 in an economizer mode. In one example, the system 1000 is configured to measure OADB temperature and the outside or scavenger air bypasses the DEC 1004 when the OADB temperature drops to and/or below an OADB temperature limit. In such cases, the outside air is cool enough that evaporative cooling is not needed to meet the load on the system 1000 and bypassing the DEC 1004 can increase efficiency, reduce power consumption, and/or increase the longevity of the DEC 1004.

In one example, three fans 1020 are shown in FIG. 12 in the top level 1006, although it is recognized that more or less fans can be used. FIG. 12 illustrates various access doors 1007 on the top level 1006.

The system 1000 can operate similar to the system 200 of FIG. 2 and can include the various operating modes similar to the system 200. As such, in some examples, the system 1000 can include a bypass for the condenser coil 1042 and a bypass for the DX coil 1040. Although the condenser coil bypass and DX coil bypass are not shown in FIGS. 10-12, it is recognized that the system 1000 could include bypass dampers in the lower level 1008 above the DX coil 1040 or in the upper level 1006 above the condenser coil 1042. (See, for example, the bypass dampers 244 and 246 in FIG. 2 for the system 200.)

The foregoing examples include a cooling system that combines a DEC and sensible wheel to cool the air in an enclosed space, such as, for example, a data center. However, in other examples, different kinds of AAHXs, such as, but not limited to, Glycol Run-around loops, heat pipes, or cross-flow AAHX, can be used with a DEC to indirectly cool the air for the data center (or other enclosed space).

A system or unit configuration using a Glycol run-around loop and heat pipe along with a DEC can be similar to the example system 100 of FIG. 1. In such an example, a Glycol run-around loop or heat pipe may be used instead of a sensible wheel to reject heat from the process air stream to the scavenger airstream. With a Glycol run-around loop, the process and scavenger air ducts do not need to be side-by-side, which may be one advantage of using a Glycol run-around loop in this system. Other configurations for the process and scavenger air streams as shown in other figures, such as for example the systems of FIGS. 2 and 5-8, are possible by using a Glycol run-around loop or a heat pipe which might end up with a more compact unit design in comparison with a unit using a sensible wheel.

In terms of performance, a cooling system or unit with a sensible wheel may deliver improved performance because the sensible wheel can have one of the highest sensible performances, relative to other types of AAHXs. The AAHX sensible performance directly affects the overall system performance (i.e., wet-bulb effectiveness).

Figure 13:
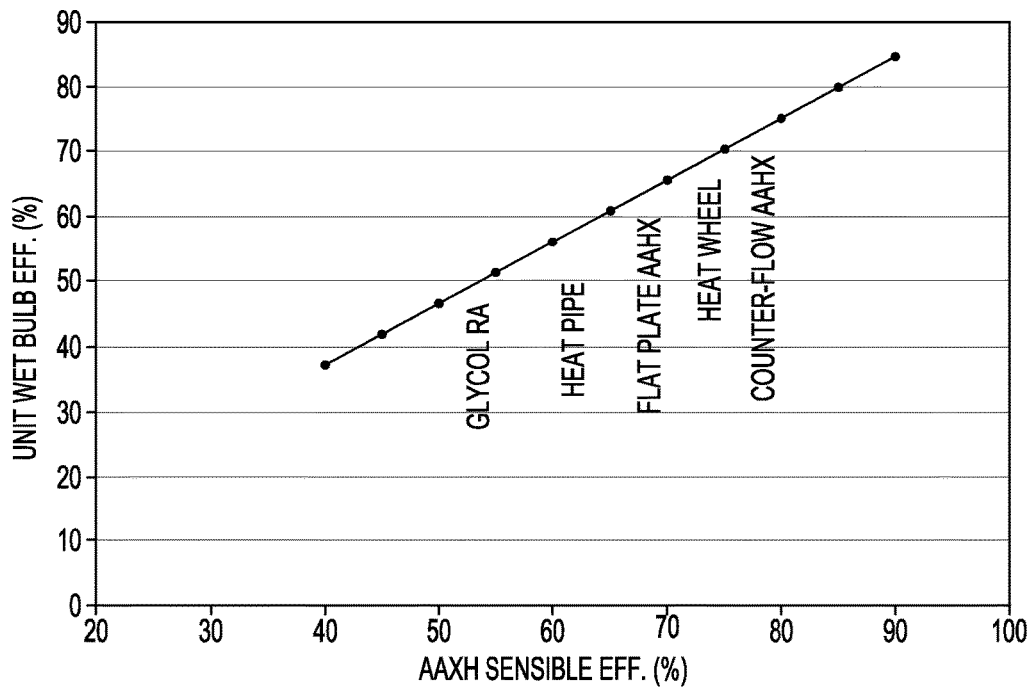
FIG. 13 is a graph illustrating the impact of sensible performance of an air-to-air heat exchanger (AAHX) on an overall system performance.
Figure 14:
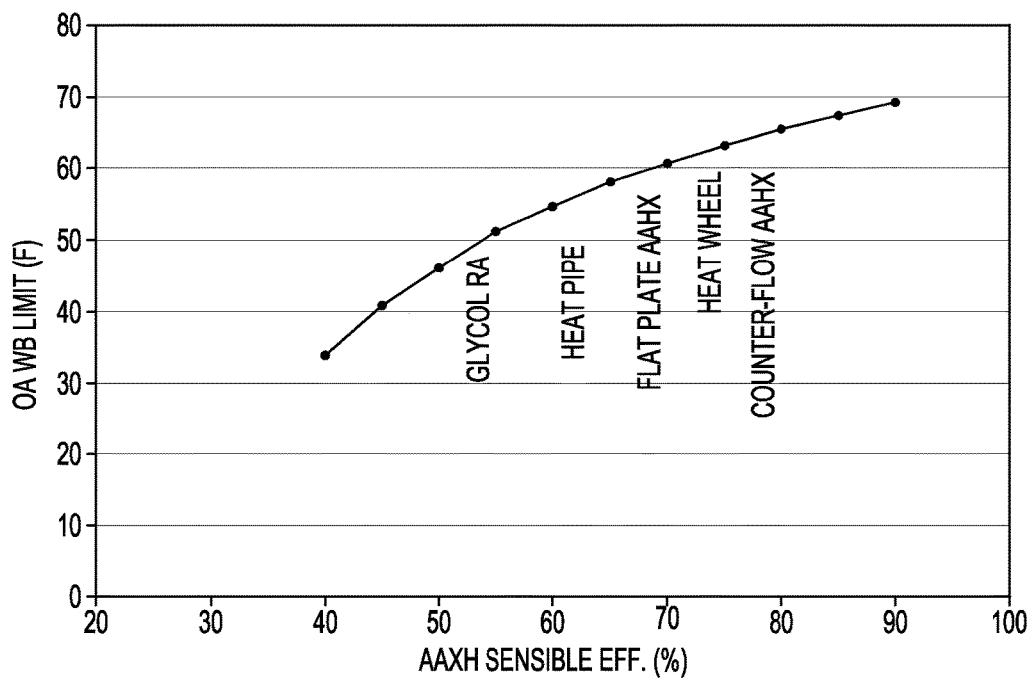
FIG. 14 is a graph illustrating the impact of sensible performance of an AAHX on an outdoor air wet bulb (OAWB) limit.

FIG. 13 depicts the effect of an AAHX on overall system performance or unit wet bulb effectiveness, as provided above as Equation 1 in reference to values shown in Table 1. FIG. 14 depicts the effect of an AAHX on the system outdoor air wet-bulb limit to reject 100% of the heat from an enclosed space, such as a data center, using only evaporation. The conditions used in the example presented in the graphs of FIGS. 13 and 14 are as follows: Hot aisle return air: 100° F. dry bulb/50° F. dew point; Outdoor air conditions: 95° F. dry bulb/60° F. wet bulb; Process and scavenger air flow rates: 11,000 cubic feet per minute; DEC effectiveness used in the unit: 95%; and Range of study for the AAHA sensible effectiveness: 40% to 90%.

As indicated by the graphs of FIGS. 13 and 14, in some examples, one type of AAHX, a counter-flow AAHX, may enable improved system performance in combination with a DEC in the scavenger air stream—this is compared to other types of AAHX, including a sensible wheel or heat wheel.

Figure 15:
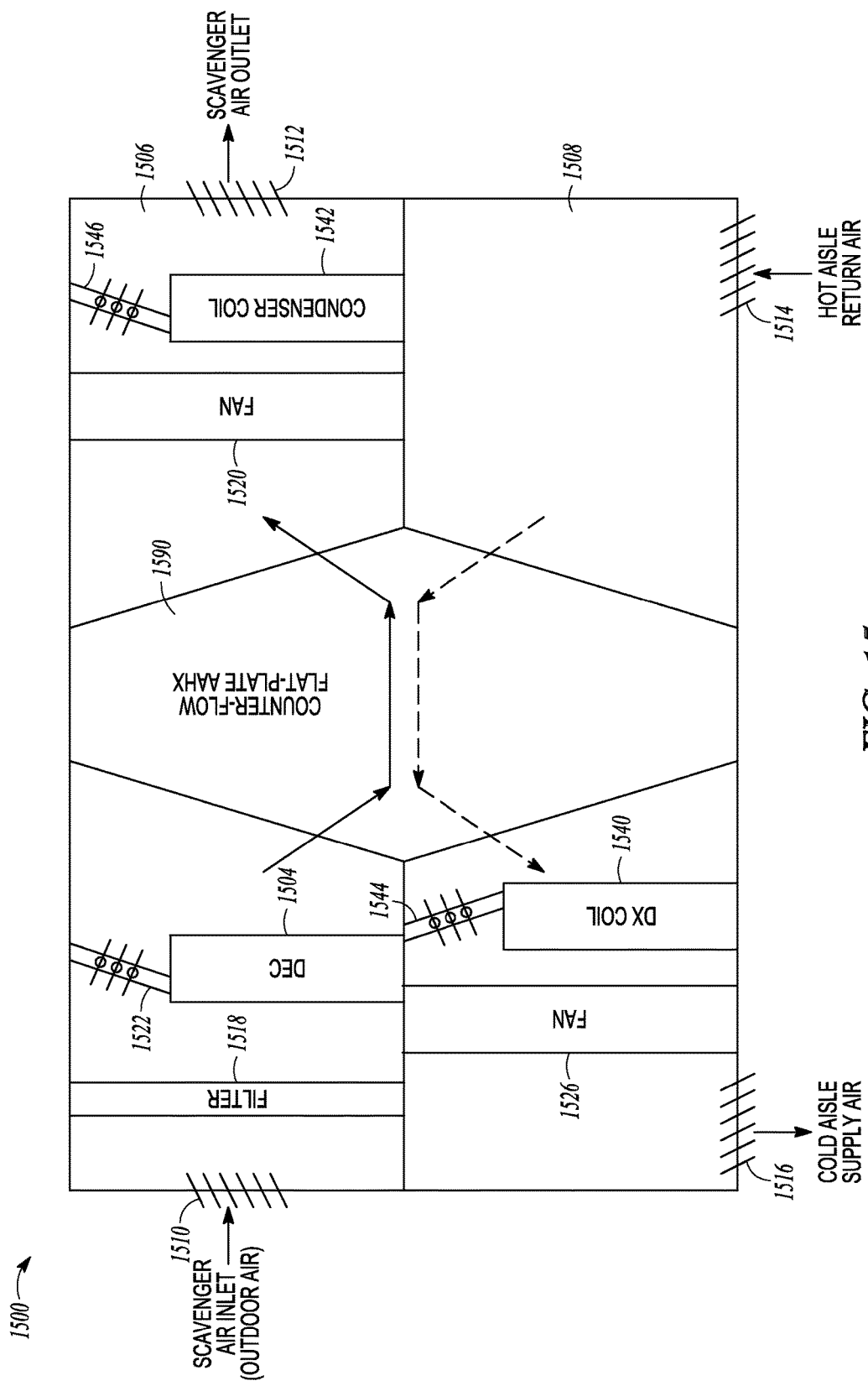
FIG. 15 is a schematic of an example roof-top system in accordance with the present patent application.
Figure 16:
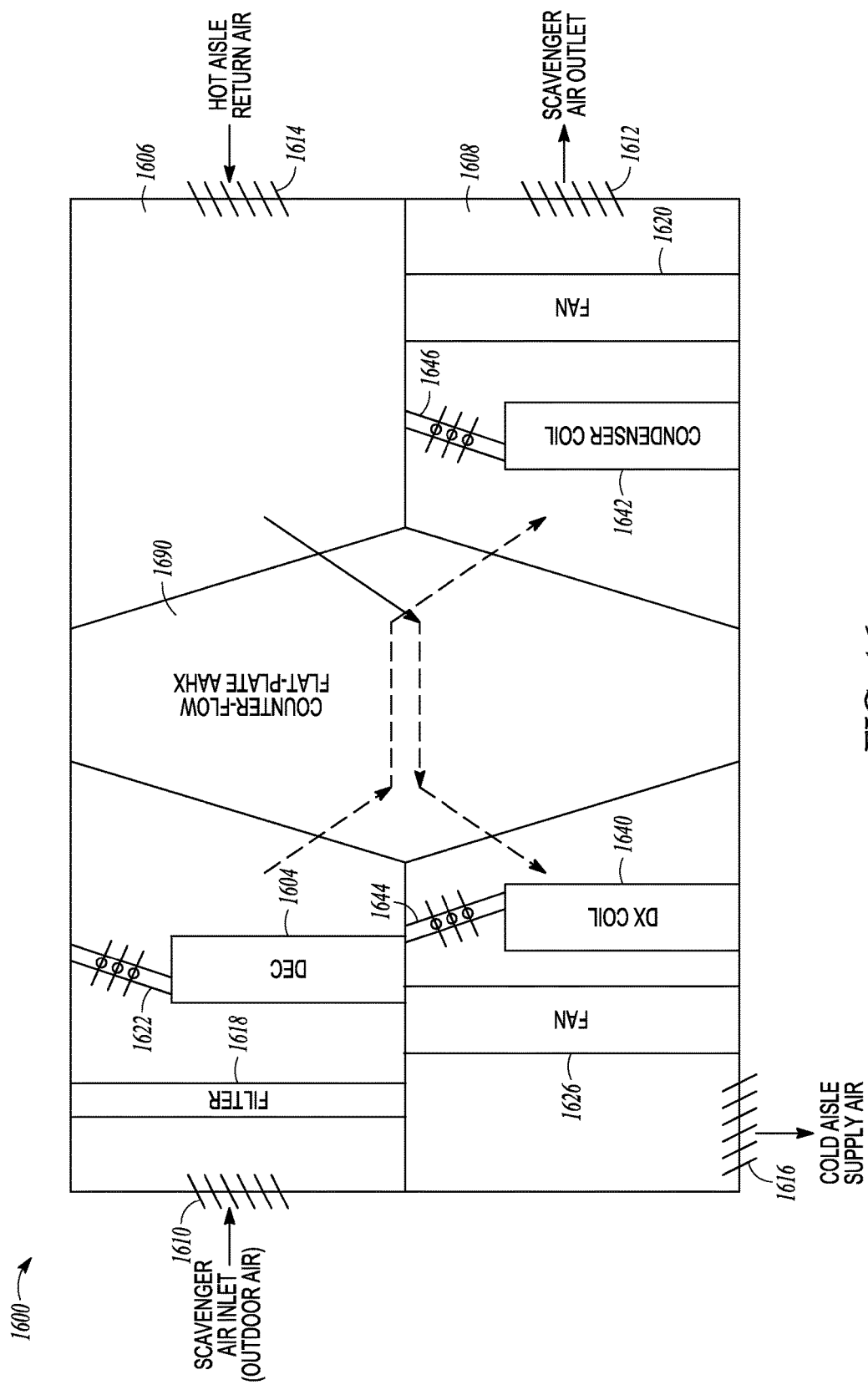
FIG. 16 is a schematic of an example roof-top system in accordance with the present patent application.

FIGS. 15 and 16 depict two example systems including a DEC in the scavenger air stream in combination with a counter-flow flat-plate AAHX that can be used to cool the air in an enclosed space like a data center.

FIG. 15 depicts an example roof-top delivery system 1500, although it is recognized that the system 1500 can be modified for end-on delivery applications. The system 1500 can run in the three modes described above—economizer, evaporation, and DX (evaporation plus DX). The system 1500 can include a top level 1506 that receives outdoor or scavenger air through a scavenger air inlet 1510 and a bottom level 1508 that receives process or hot aisle return air through a process air inlet 1514. (The direction of the scavenger air stream is from left to right and the process air stream is from right to left. This is opposite to the direction of the roof-top delivery systems shown in FIGS. 1-2, 5-8 and 10-12. It is recognized that either arrangement for any of the roof-top delivery systems can be used.)

The system 1500 is similar to the system 200 of FIG. 2 in that the top level 1506 includes a filter 1508, a DEC 1504, a fan 1520 and a condenser coil 1542, and the bottom level 1508 includes a DX coil 1540 and a fan 1526. Although a filter is not shown in the bottom level 1508 in FIG. 15, it is recognized that the system 1500 can include a filter as similarly shown in FIG. 2 for the system 200.

Instead of a sensible wheel, the system 1500 can include a counter-flow flat-plate AAHX 1590 that can use the scavenger air exiting the DEC 1504 to cool or reject heat from the process air in the bottom level 1508. As shown in FIG. 15, in one example, the system 1500 can operate with the AAHX 1590 as a counter-flow flat plate exchanger with counter parallel flow since the scavenger air and the process air flow in opposite directions, but remain parallel to one another.

As described above in the example systems including a sensible wheel, the top 1506 and bottom 1508 levels of the system 1500 can be separated from each other using a partition or other structure. As such, the scavenger air and the process air can remain separate as each flows through the system 1500. As also described in reference to the sensible wheel, the AAHX 1590 can span, or be at least partially disposed in, both the top 1506 and bottom 1508 levels.

As described above in reference to the system having a sensible wheel in combination with a DEC, and potentially other components, the system 1500, as well as the system 1600, is a 100% recirculation system for the process air entering the system 1500. Moreover, as also described above, the process air and the scavenger air remain essentially separate from one another and do not intermix in the systems 1500 and 1600, with the exception of air leakage in, for example, the AAHX.

The system 1500 can include dampers 1522, 1544 and 1546 which can facilitate operation of the three modes described above in a similar manner as described above for the system 200.

Although only the DX coil 1640 and the condenser coil 1642 are included in FIG. 15 (and similarly in FIG. 16), it is recognized that the DX 1640 and condenser 1642 coils are part of a DX system as similarly described above in FIG. 3.

FIG. 16 depicts an example roof-top delivery system 1600, which can be modified for end-on delivery applications. The system 1600 can be similar to the system 1500 and include a counter-flow flat-plate AAHX 1690, as well as the other components described above in reference to the system 1500. However, the counter-flow flat-plate AAHX 1690 can operate with counter cross flow—the scavenger air and the process air flow in opposite directions and actually cross paths in the AAHX 1690.

In one example, the system 1600 can be a two level unit, as shown in FIG. 16, having a top level 1606 and a bottom level 1068. However, in contrast to the system 1500, both the scavenger air and the process air enter the top level 1606 at a scavenger air inlet 1610 and a process air inlet 1614, respectively. The inlets 1610 and 1614 are located generally at opposite ends of the top level 1606. The scavenger and process air flows cross paths in the AAHX 1690 and the scavenger air exits the AAHX 1690 in the bottom level 1608. The scavenger air exits the system 1600 at a scavenger air outlet 1612 located at an opposite end relative to the inlet 1610. The process air exits the AAHX 1690 in the bottom level 1608 and exits the system 1600 at a process air outlet 1616 at an opposite end relative to the inlet 1614. The process air outlet 1616 is at an opposite end of the bottom level 1608 relative to the scavenger air outlet 1612. Both air streams flow from left to right, or right to left, across a length of the system 1600.

As shown in FIG. 16, the fan 1620 can be located in the scavenger air flow path after the condenser coil 1642, which is opposite from the configuration in FIG. 15. (See the fan 1520 located before the condenser coil 1520.) As described above in the context of the systems using a sensible wheel, the fan and condenser coil can be arranged in various configurations.

It is recognized that systems similar to the systems 1500 and 1600, which include a counter-flow flat plate AAHX, instead of a sensible wheel, in combination with a DEC, can also include additional components and features of the systems described above in FIGS. 3-12. As an example, a cooling system similar to the system 600 of FIG. 6 could include a counter-flow flat plate AAHX instead of the sensible wheel 602, but include essentially the same additional components, including a DX coil located in the DEC.

In addition to potential performance benefits, counter-flow AAHX systems, in accordance with the examples described herein, can provide a similar reduction in overall system size, like a sensible wheel, as compared to systems including other AAHXs. Moreover, counter-flow AAHX system may also reduce system costs relative to systems including other AAHXs, including systems having a sensible wheel.

Although the examples of FIGS. 1, 2, 5-8, and 10-12 depict an optional filter upstream in the direction of air flow from an AAHX (e.g., sensible wheel or counter-flow flat-plate), in other examples the filter could be arranged downstream from the AAHX. Additionally, in the example of FIG. 2, the condenser coil 242 is arranged downstream of the fan 220 on the scavenger air side of the system 200. However, in another example, the condenser coil 242 can be arranged upstream of the fan 220 on the scavenger air side of the system.

The examples of FIGS. 2, 5-8, 10-12, 15 and 16 include a DX cooling system with a fan downstream of the AAHX (e.g., the sensible wheel in FIGS. 2, 5-8 and 10-12, and a counter-flow flat-plate HX in FIGS. 15 and 16) in the process air flow path, which is sometimes referred to as a "draw through" configuration. However, in other examples in accordance with this disclosure, a fan could be arranged upstream of the AAHX in the process air flow path, which is sometimes referred to as a "blow through" configuration.

The present disclosure includes methods of operating a cooling system to control temperature in an enclosed space, such as, for example, a data center. Methods can include directing a scavenger air stream and a process air stream through a cooling system having an AAHX and a DEC as shown and described herein. The cooling system can include various combinations of the components and features described above. The methods can include determining an operating mode of the cooling system based on one or more parameters, such as, for example, the outdoor air conditions. The method can include adjusting the cooling system, such as opening and closing inlets and dampers, based on the operating mode.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

Examples, as described herein, may include, or may operate on, logic or a number of components, modules, or mechanisms. Modules may be hardware, software, or firmware communicatively coupled to one or more processors in order to carry out the operations described herein. Modules may hardware modules, and as such modules may be considered tangible entities capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations. Accordingly, the term hardware module is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software; the general-purpose hardware processor may be configured as respective different modules at different times. Software may accordingly configure a hardware processor, for example, to constitute a particular module at one instance of time and to constitute a different module at a different instance of time. Modules may also be software or firmware modules, which operate to perform the methodologies described herein.

The above description is intended to be illustrative, and not restrictive. For example, the above-described examples (or one or more aspects thereof) may be used in combination with each other. Other embodiments can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The present application provides for the following exemplary embodiments or examples, the numbering of which is not to be construed as designating levels of importance:

Example 1 provides a system for controlling temperature in an enclosed space and can comprise an air-to-air heat exchanger (AAHX) arranged in a flow path of process air between a process air inlet and outlet and in a flow path of scavenger air between a scavenger air inlet and outlet, and a direct evaporative cooler (DEC) arranged in the flow path of the scavenger air between the AAHX and the scavenger air inlet. The AAHX can include at least one of a counter-flow flat-plate heat exchanger and a sensible wheel.

Example 2 provides the system of Example 1 optionally further comprising a direct expansion (DX) system to provide additional cooling to the process air exiting the AAHX.

Example 3 provides the system of Example 2 optionally configured such that the DX system comprises a DX coil arranged in the flow path of the process air between the AAHX and the process air outlet, and a condenser coil arranged in the scavenger air flow path between the AAHX and the scavenger air outlet.

Example 4 provides the system of Example 2 optionally configured such that the DX system comprises a DX coil arranged in the flow path of the process air between the AAHX and the process air outlet and a liquid-to-liquid heat exchanger arranged in the scavenger air flow path between the scavenger air inlet and the AAHX.

Example 5 provides the system of Example 4 optionally configured such that water from the DEC flows through the liquid-to-liquid heat exchanger and conditions refrigerant flowing from the DX coil through the liquid-to-liquid heat exchanger.

Example 6 provides the system of Example 2 optionally configured such that the DX system comprises a DX coil located in a collection tank of the DEC and configured to cool water in the collection tank.

Example 7 provides the system of Example 6 optionally further comprising a second DX coil arranged in the process air flow path between the AAHX and the process air outlet.

Example 8 provides the system of any of Examples 1-7 optionally further comprising a pre-cooling coil arranged in the scavenger air flow path between the scavenger air inlet and the AAHX.

Example 9 provides the system of Example 8 optionally further comprising a cooling coil arranged in the process air flow path between the AAHX and the process air outlet, wherein water from the DEC flows through the cooling coil, the water flows back to the DEC or through the pre-cooling coil and then the DEC, depending on conditions of the scavenger air at the scavenger air inlet.

Example 10 provides the system of Example 9 optionally further comprising a DX coil arranged in the process air flow path between the cooling coil and the process air outlet.

Example 11 provides the system of any of Examples 1-10 optionally configured such that the flow path of the scavenger air is through a top portion of the system and the flow path of the process air is through a bottom portion of the system, and the system is configured for use on a roof top of a building containing the enclosed space.

Example 12 provides the system of Example 10 optionally further comprising a partition separating the top and bottom portions of the system, and wherein the flow path of the scavenger air and the flow path of the process air remain separate from one another in the system.

Example 13 provides the system of Example 12 optionally configured such that the AAHX is disposed in both the top and bottom portions of the system.

Example 14 provides the system of any of Examples 1-10 optionally configured such that the system is an end-on delivery system configured for attachment to a side of a building containing the enclosed space, and the flow path of the scavenger air is through a first side portion of the system and the flow path of the process air is through a second side portion of the system such that the flow paths remain separate from one another in the system.

Example 15 provides the system of Example 14 optionally further comprising a partition separating the first and second sides of the unit, and the AAHX is disposed in both the first and second side portions.

Example 16 provides the system of any of Examples 1-15 optionally configured such that the enclosed space is a data center.

Example 17 provides the system of any of Examples 1-16 optionally configured such that the AAHX is a counter-flow flat plate heat exchanger configured for counter-parallel flow such that the flow path of the scavenger air is in an opposite direction of the flow path of the process air.

Example 18 provides the system of any of Examples 1-16 optionally configured such that the AAHX is a counter-flow flat plate heat exchanger configured for counter-cross flow such that the flow path of the scavenger air crosses the flow path of the process air inside the AAHX.

Example 19 provides a system for controlling a temperature in an enclosed space. The system can include a sensible wheel arranged in a first flow path of process air between a process air inlet and outlet and in a second flow path of scavenger air between a scavenger air inlet and outlet, and a direct evaporative cooler arranged in the second flow path upstream of the sensible wheel. The system can also include a bypass configured to direct the scavenger air into the second flow path at a location downstream of the DEC and upstream of the sensible wheel.

Example 20 provides the system of Example 19 optionally configured such that the bypass is a damper and the scavenger air inlet is closed when the damper is open.

Example 21 provides the system of Example 20 optionally configured such that the damper is open when the system is run in an economizer mode such that the sensible wheel sufficiently conditions the process air without the direct evaporative cooler.

Example 22 provides the system of Example 21 optionally configured such that the damper is closed and the scavenger air inlet is open in an evaporation mode.

Example 23 provides the system of any of Examples 19-22 optionally configured such that the process air comprises return air and supply air, the return air being received from the enclosed space through the process air inlet and conditioned by the sensible wheel to produce the supply air transmitted back into the enclosed space through the process air outlet.

Example 24 provides the system of any of Examples 19-23 optionally configured such that the scavenger air comprises outside air and exhaust, the outside air being received from outside the enclosed space through the scavenger air inlet and conditioned by the direct evaporative cooler and the sensible wheel to produce the exhaust transmitted outside the enclosed space through the scavenger air outlet.

Example 25 provides the system of any of Examples 19-24 optionally configured such that the first flow path is through a first portion of the system and the second flow path is through a second portion of the system, wherein the system further comprises a partition separating the first and second portions, and the first and second flow paths remain separate from one another in the system.

Example 26 provides the system of Example 25 optionally configured such that the sensible wheel spans across both the first and second portions of the system.

Example 27 provides the system of any of Examples 19-26 optionally further comprising a direct expansion cooling device arranged in the first flow path between the sensible wheel and the process air outlet.

Example 28 provides the system of Example 27 optionally further comprising a condenser arranged in the second flow path between the sensible wheel and the scavenger air outlet, and configured to receive a refrigerant from the direct expansion cooling device such that the scavenger air conditions the refrigerant.

Example 29 provides the system of Example 28 optionally configured such that the condenser comprises at least one of an air cooled and a water cooled condenser.

Example 30 provides the system of any of Examples 27-29 optionally configured such that the system is run in an evaporation-plus-DX mode in which the direct expansion cooling device provides cooling to the process air exiting the sensible wheel, and the evaporation-plus-DX mode operates when the sensible wheel and the DEC cannot sufficiently condition the process air without the direct expansion cooling device.

Example 31 provides the system of any of Examples 19-30 optionally further comprising a cooling coil arranged in the first flow path between the sensible wheel and the direct expansion cooling device.

Example 32 provides the system of any of Examples 19-31 optionally further comprising a pre-cooling coil arranged in the second flow path between the scavenger air inlet and the direct evaporative cooler.

Example 33 provides the system of any of Examples 19-32 optionally further comprising a direct expansion cooling device in the DEC for conditioning water used in the DEC.

Example 34 provides the system of Example 33 optionally further comprising a direct expansion cooling device arranged in the first flow path between the sensible wheel and the process air inlet and configured as a back-up cooling system to the DEC.

Example 35 provides a system for controlling temperature in an enclosed space. The system can include a sensible wheel arranged in a flow path of process air between a process air inlet and outlet and in a flow path of scavenger air between a scavenger air inlet and outlet, the scavenger air conditioning the process air using the sensible wheel, a direct evaporative cooler (DEC) arranged in the scavenger air flow path upstream of the sensible wheel. The direct evaporative cooler can condition the scavenger air prior to the scavenger air passing through the sensible wheel. The system can also include a direct expansion cooling device arranged in the process air flow path downstream of the sensible wheel for further conditioning the process air exiting the sensible wheel. The scavenger air flow path and process air flow path can be separate from one another in the system.

Example 36 provides the system of Example 35 optionally further comprising one or more bypass features that allow the system to run in an economizer mode and an evaporation mode, wherein the direct evaporative cooler and the direct expansion cooling device are bypassed in the economizer mode, and the direct expansion cooling device is bypassed in the evaporation mode.

Example 37 provides the system of Example 36 optionally configured such that the one or more bypass features includes a DEC bypass damper located downstream of the direct evaporative cooler, and the DEC bypass damper is open and the scavenger air inlet is closed in the economizer mode.

Example 38 provides the system of any of Examples 35-37 optionally further comprising a condenser located in the scavenger air flow path and configured to condition a refrigerant exiting the direct expansion cooling device.

Example 39 provides the system of Example 38 optionally configured such that the one or more bypass features includes a DX bypass damper in the process air flow path and a condenser bypass damper in the scavenger air flow path, and wherein the DX bypass damper and the condenser bypass damper are open in the economizer and evaporation modes, and the DX bypass damper and the condenser bypass damper are closed in an evaporation-plus-DX mode.

Example 40 provides the system of any of Examples 35-39 optionally configured such that the system includes a set point temperature for the process air at the process air outlet, and an operating mode of the system is selected based on a comparison of a measured temperature at the process air outlet to the set point temperature.

Example 41 provides the system of any one of Examples 35-39 optionally configured such that the system includes a target temperature range for the process air at the process air outlet, and an operating mode of the system is selected based on a comparison of a measured temperature at the process air outlet to the target temperature range.

Example 42 provides a method of conditioning air in an enclosed space. The method can include passing scavenger air through a first portion of a conditioning system, the scavenger air entering the first portion at a scavenger air inlet and exiting the first portion at a scavenger air outlet, and passing process air through a second portion of the conditioning system, the process air entering the second portion at a process air inlet and exiting the second portion at a process air outlet. The method can also include passing the scavenger air through a direct evaporative cooler (DEC) arranged in the first portion of the conditioning system to cool the scavenger air, and passing the cooled scavenger air and the process air through an air-to-air heat exchanger (AAHX) arranged in the conditioning system downstream of the direct evaporative cooler. The cooled scavenger air can sensibly cool the process air in the AAHX. The AAHX can be arranged partially in the first portion of the conditioning system and partially in the second portion of the conditioning system. The AAHX can include at least one of a counter-flow flat-plate heat exchanger and a sensible wheel.

Example 43 provides the method of Example 42 optionally further comprising bypassing the DEC in an economizer mode by closing the scavenger air inlet and directing the scavenger air to enter the first portion at a location downstream of the DEC.

Example 44 provides the method of any of Example 42 or 43 optionally further comprising passing the process air through a direct expansion cooling device arranged in the second portion of the conditioning system downstream of the AAHX, wherein the direct expansion cooling device provides additional cooling to the process air exiting the AAHX.

Example 45 provides the method of Example 44 optionally further comprising passing the scavenger air through a condenser coil arranged in the first portion of the conditioning system downstream of the AAHX, wherein the condenser coil cools the refrigerant from the direct expansion cooling device, using the scavenger air.

Example 46 provides the method of any of Examples 42-45 optionally further comprising determining an operating mode of the conditioning system as a function of a set point temperature, wherein the set point temperature is compared to a measured temperature at the process air outlet.

Example 47 provides the method of any of Examples 42-46 optionally configured such that the first and second portions of the conditioning system are separate from each other such that the scavenger air and the process air pass through the conditioning system separately and remain as separate flow paths.

Example 48 provides the method of any of Examples 42-47 optionally configured such that the process air at the process air inlet is hot aisle return air from a data center and the process air at the process air outlet is cold aisle supply air.

Example 49 provides the method of any of Examples 42-48 optionally configured such that the first portion is a top level and the second portion is a bottom level, and the conditioning system is configured as a roof-top delivery system.

Example 50 provides the method of any of Examples 42-48 optionally configured such that the first portion and the second portion are arranged side-by-side, and the conditioning system is configured as an end-on delivery system for attachment to a side of a building.

Example 51 provides the method of any of Examples 42-50 optionally configured such that the AAHX is a counter-flow flat plate heat exchanger configured for counter-parallel flow such that the flow path of the scavenger air is in an opposite direction of the flow path of the process air.

Example 52 provides the method of any of Examples 42-50 optionally configured such that the AAHX is a counter-flow flat plate heat exchanger configured for counter-cross flow such that the flow path of the scavenger air crosses the flow path of the process air inside the AAHX.

Example 53 provides a method, system, unit, product or apparatus of any one or any combination of Examples 1-52, which can be optionally configured such that all steps or elements recited are available to use or select from.

Various aspects of the disclosure have been described. These and other aspects are within the scope of the following claims.

What is claimed is:

1. A system for controlling temperature in an enclosed space, the system comprising:
   an air-to-air heat exchanger (AAHX) arranged in a flow path of process air between a process air inlet and outlet and in a flow path of scavenger air between a scavenger air inlet and outlet, the AAHX comprising at least one of a counter-flow flat-plate heat exchanger and a sensible wheel;
   a direct evaporative cooler (DEC) arranged in the flow path of scavenger air between the AAHX and the scavenger air inlet; and
   a direct expansion (DX) system to provide additional cooling to the process air exiting the AAHX, the DX system comprising:
      a DX coil arranged in the flow path of process air between the AAHX and the process air outlet; and
      a liquid-to-liquid heat exchanger arranged in the flow path of scavenger air between the scavenger air inlet and the AAHX.

2. The system of claim 1, wherein water from the DEC flows through the liquid-to-liquid heat exchanger and conditions refrigerant flowing from the DX coil through the liquid-to-liquid heat exchanger.

3. The system of claim 1 wherein the flow path of scavenger air is through a top portion of the system and the flow path of process air is through a bottom portion of the system, and the system is configured for use on a rooftop of a building containing the enclosed space.

4. The system of claim 3 further comprising a partition separating the top and bottom portions of the system, and wherein the flow path of scavenger air and the flow path of process air remain separate from one another in the system.

5. The system of claim 4 wherein the AAHX is disposed in both the top and bottom portions of the system.

6. The system of claim 1 wherein the enclosed space is a data center.

7. The system of claim 1 wherein the AAHX is a counter-flow flat plate heat exchanger configured for counter-parallel flow such that the flow path of scavenger air is in an opposite direction of the flow path of process air.

8. A system for controlling temperature in an enclosed space using multiple modes of operation, the system comprising:
   a sensible wheel arranged in a first flow path of process air between a process air inlet and outlet and in a second flow path of scavenger air between a scavenger air inlet and outlet;
   a direct evaporative cooler (DEC) arranged in the second flow path upstream of the sensible wheel to selectively provide evaporative cooling to the scavenger air in the second flow path in a second mode of operation and a third mode of operation; and a direct expansion (DX) coil configured to selectively provide additional cooling to the process air in the first flow path in the third mode of operation, wherein the system is configured to selectively operate in a first mode of operation when the sensible wheel sufficiently conditions the process air without the DEC and DX coil, and wherein the system switches to the second and third modes as additional cooling is required to condition the process air.

9. The system of claim 8, further comprising one or more bypass features for operating the system in the first or second mode.

10. A method of conditioning air in an enclosed space, the method comprising:

passing scavenger air through a first portion of a conditioning system, the scavenger air entering the first portion at a scavenger air inlet and exiting the first portion at a scavenger air outlet;

passing process air through a second portion of the conditioning system, the process air entering the second portion at a process air inlet and exiting the second portion at a process air outlet;

passing the scavenger air through a direct evaporative cooler (DEC) arranged in the first portion of the conditioning system to cool the scavenger air;

passing the cooled scavenger air and the process air through an air-to-air heat exchanger (AAHX) arranged in the conditioning system downstream of the direct evaporative cooler, wherein the cooled scavenger air sensibly cools the process air in the AAHX, wherein the AAHX is arranged partially in the first portion of the conditioning system and partially in the second portion of the conditioning system, and wherein the AAHX comprises at least one of a counter-flow flat-plate heat exchanger and a sensible wheel; and bypassing the DEC in an economizer mode by closing the scavenger air inlet and directing the scavenger air to enter the first portion at a location downstream of the DEC.

11. The method of claim 10 further comprising:

passing the process air through a direct expansion cooling device arranged in the second portion of the conditioning system downstream of the AAHX, wherein the direct expansion cooling device provides additional cooling to the process air exiting the AAHX.

12. The method of claim 11 further comprising:

passing the scavenger air through a condenser coil arranged in the first portion of the conditioning system downstream of the AAHX, wherein the condenser coil cools a refrigerant from the direct expansion cooling device, using the scavenger air.

13. A method of conditioning air in an enclosed space using multiple modes of operation, the method comprising:

passing scavenger air through a first portion of a conditioning system, the scavenger air entering the first portion at a scavenger air inlet and exiting the first portion at a scavenger air outlet;

passing process air through a second portion of the conditioning system, the process air entering the second portion at a process air inlet and exiting the second portion at a process air outlet;

passing the scavenger air and the process air through an air-to-air heat exchanger (AAHX) arranged partially in the first portion of the conditioning system and partially in the second portion of the conditioning system such that the scavenger air sensibly cools the process air in the AAHX; selectively using a direct evaporative cooler (DEC) arranged in the first portion of the conditioning system upstream of the AAHX to cool the scavenger air in a second or third operating mode in which the AAHX is not sufficient to condition the process air without the DEC;

selectively using a direct expansion cooling device arranged in the second portion of the conditioning system downstream of the AAHX to provide additional cooling to the process air exiting the AAHX in in the third operating mode in which the AAHX and DEC are not sufficient to condition the process air without the direct expansion cooling device, a first operating mode excludes the DEC and direct expansion cooling device; and operating the system at the lowest operating mode, among the first, second and third operating modes, sufficient to adequately cool the process air.

* * * * *

UNITED STATES PATENT AND TRADEMARK OFFICE
CERTIFICATE OF CORRECTION

PATENT NO. : 10,197,310 B2
APPLICATION NO. : 14/744950
DATED : February 5, 2019
INVENTOR(S) : Ghadiri Moghaddam et al.

It is certified that error appears in the above-identified patent and that said Letters Patent is hereby corrected as shown below:

On the Title Page

On page 3, in Column 2, under "Other Publications", Line 21, delete "Eqquipment" and insert --Equipment-- therefor In the Claims In Column 26, Line 42, in Claim 3, delete "rooftop" and insert --roof top-- therefor In Column 28, Line 24, in Claim 13, after "AAHX;", insert --¶--

In Column 28, Line 33, in Claim 13, after "AAHX", delete "in" (2nd occurrence)

Signed and Sealed this
Fifth Day of January, 2021

Andrei Iancu
*Director of the United States Patent and Trademark Office*